US009425386B2

(12) United States Patent
Ausserlechner

(10) Patent No.: US 9,425,386 B2
(45) Date of Patent: *Aug. 23, 2016

(54) ELECTRONIC DEVICE WITH RING-CONNECTED HALL EFFECT REGIONS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/672,757

(22) Filed: Mar. 30, 2015

(65) Prior Publication Data

US 2015/0207061 A1 Jul. 23, 2015

Related U.S. Application Data

(63) Continuation of application No. 13/187,935, filed on Jul. 21, 2011, now Pat. No. 9,007,060.

(51) Int. Cl.
*G01R 33/07* (2006.01)
*H01L 43/06* (2006.01)
*G01D 5/14* (2006.01)
(Continued)

(52) U.S. Cl.
CPC ............... *H01L 43/065* (2013.01); *G01D 5/145* (2013.01); *G01L 1/12* (2013.01); *G01R 33/07* (2013.01); *G01R 33/072* (2013.01); *H01L 43/04* (2013.01)

(58) Field of Classification Search
CPC ................................. G01R 33/07; G01D 5/145
USPC ................................................ 324/251, 207.2
See application file for complete search history.

(56) References Cited

U.S. PATENT DOCUMENTS 3,823,354 A 7/1974 Janssen
4,141,026 A 2/1979 Bate et al.
(Continued)

FOREIGN PATENT DOCUMENTS

EP 0503141 A1 9/1992
EP 0704710 A1 4/1996
(Continued)

OTHER PUBLICATIONS

Final Office Action Dated Aug. 18, 2015 U.S. Appl. No. 13/400,214.
(Continued)

*Primary Examiner* — Reena Aurora
(74) *Attorney, Agent, or Firm* — Eschweiler & Associates, LLC

(57) ABSTRACT

An electronic device includes a number of n Hall effect regions with n>1, wherein the n Hall effect regions are isolated from each other. The electronic device also includes at least eight contacts in or on surfaces of the n Hall effect regions, wherein the contacts include: a first and a second contact of each Hall effect region. A first contact of the (k+1)-th Hall effect region is connected to the second contact of the k-th Hall effect region for k=1 to n−1, and the first contact of the first Hall effect region is connected to the second contact of the n-th Hall effect region. The at least eight contacts include at least two supply contacts and at least two sense contacts. Each Hall effect region includes at most one of the at least two supply contacts and at most one of the at least two sense contacts.

20 Claims, 20 Drawing Sheets

(51) Int. Cl.
*G01L 1/12* (2006.01)
*H01L 43/04* (2006.01)

(56) References Cited

U.S. PATENT DOCUMENTS

| | | | |
|---|---|---|---|
| 4,667,391 | A | 5/1987 | Chapuy et al. |
| 4,829,352 | A | 5/1989 | Popovic et al. |
| 5,572,058 | A | 11/1996 | Biard |
| 5,880,586 | A | 3/1999 | Dukart et al. |
| 6,008,643 | A | 12/1999 | Mani et al. |
| 6,542,068 | B1 | 4/2003 | Drapp et al. |
| 6,590,389 | B1 | 7/2003 | Shibasaki et al. |
| 6,768,301 | B1 | 7/2004 | Hohe et al. |
| 7,394,244 | B2 | 7/2008 | Schley et al. |
| 7,511,484 | B2 | 3/2009 | Oohira et al. |
| 7,782,050 | B2 | 8/2010 | Ausserlechner et al. |
| 7,872,322 | B2 | 1/2011 | Schott et al. |
| 2006/0011999 | A1 | 1/2006 | Schott et al. |
| 2007/0029999 | A1 | 2/2007 | Middelhoek et al. |
| 2009/0121707 | A1 | 5/2009 | Schott |
| 2009/0256559 | A1 | 10/2009 | Ausserlechner et al. |
| 2010/0019331 | A1 | 1/2010 | Kilian |
| 2010/0123458 | A1 | 5/2010 | Schott |
| 2010/0133632 | A1 | 6/2010 | Schott |
| 2010/0164491 | A1 | 7/2010 | Kejik et al. |
| 2013/0015853 | A1 | 1/2013 | Raz et al. |
| 2013/0021026 | A1 | 1/2013 | Ausserlechner et al. |
| 2013/0021027 | A1 | 1/2013 | Ausserlechner et al. |
| 2013/0214775 | A1 | 8/2013 | Ausserlechner et al. |

FOREIGN PATENT DOCUMENTS

| | | |
|---|---|---|
| EP | 0947846 A2 | 10/1999 |
| EP | 1436849 A2 | 7/2004 |
| EP | 1438755 A2 | 7/2004 |
| JP | 58154263 A | 9/1983 |
| JP | S6327075 A | 2/1988 |
| WO | 03036732 A2 | 5/2003 |
| WO | 03036733 A2 | 5/2003 |
| WO | 2004025742 A1 | 3/2004 |
| WO | 2006074989 A2 | 7/2006 |
| WO | 2008145662 A1 | 12/2008 |

OTHER PUBLICATIONS

R.S. Popovic, "Hall Devices for Magnetic Sensor Microsystems", IEEE 1997 International Conference on Solid-State Sensors and Actuators, Chicago, Jun. 16-19, 1997, p. 377-380.
Ch. Schott, et al., "Linearizing Integrated Hall Devices", IEEE 1997 International Conference on Solid-State Sensors and Actuators, Chicago, Jun. 16-19, 1997, p. 393-396.
Non-Final Office Action dated May 14, 2014 for U.S. Appl. No. 13/187,935.
Non-Final Office Action dated Dec. 29, 2014 for U.S. Appl. No. 13/400,214.
Notice of Allowance dated Dec. 15, 2014 for U.S. Appl. No. 13/187,935.
Notice of Allowance dated Nov. 21, 2014 for U.S. Appl. No. 13/187,970.
Non-Final Office Action dated Jun. 25, 2014 for U.S. Appl. No. 13/187,970.
Notice of Allowance Dated Dec. 8, 2015 U.S. Appl. No. 13/400,214.
Non-Final Office Action dated Jun. 29, 2016 for U.S. Appl. No. 14/611,367.

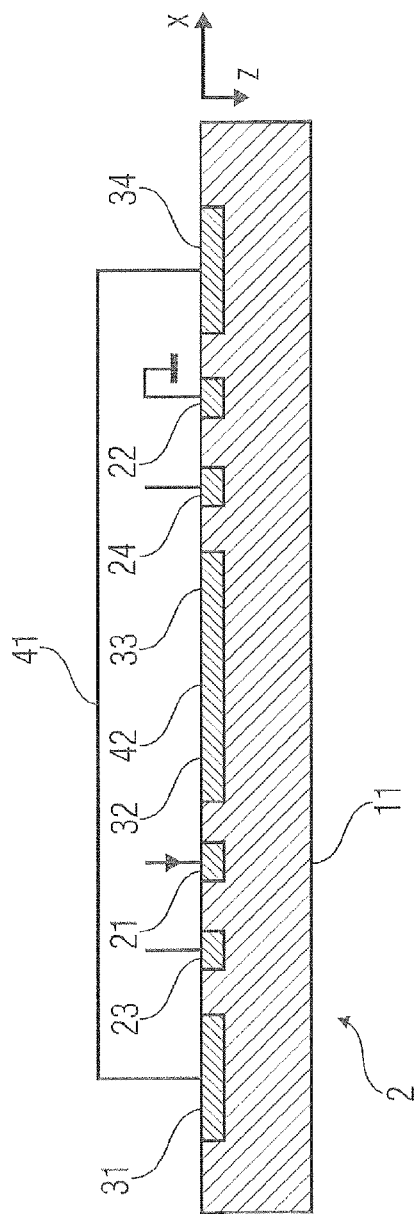
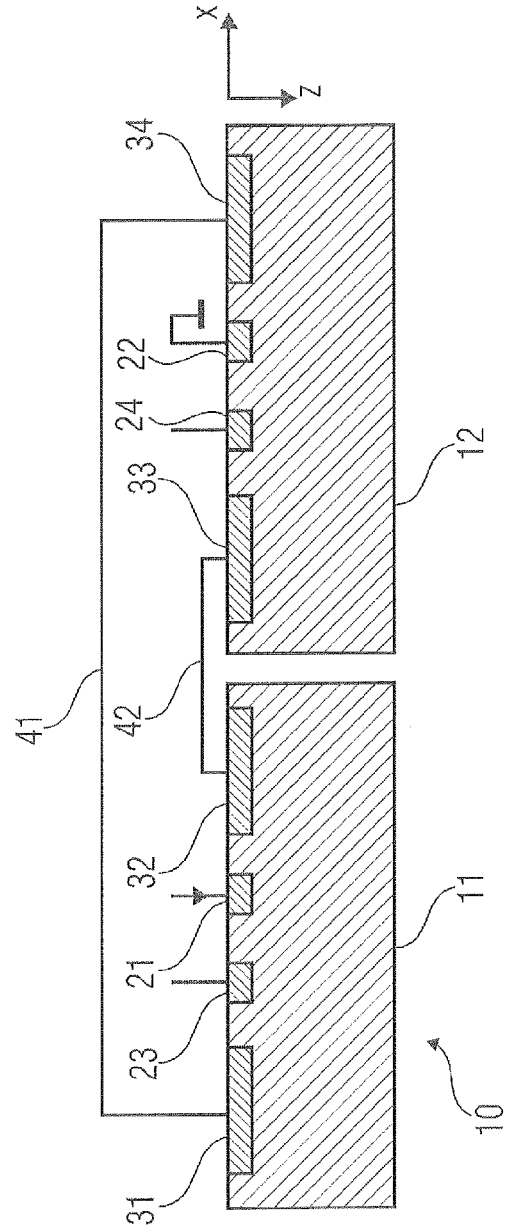

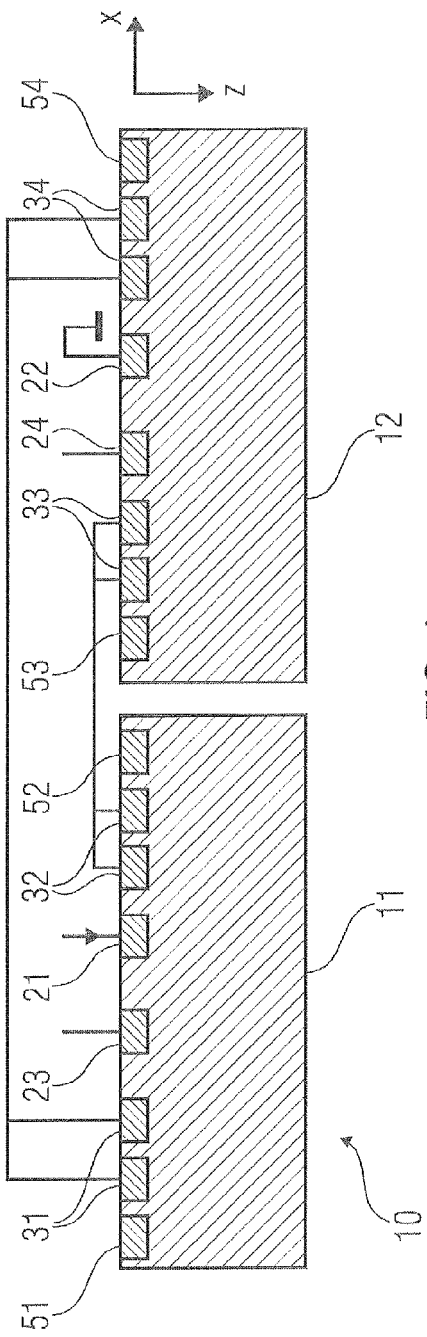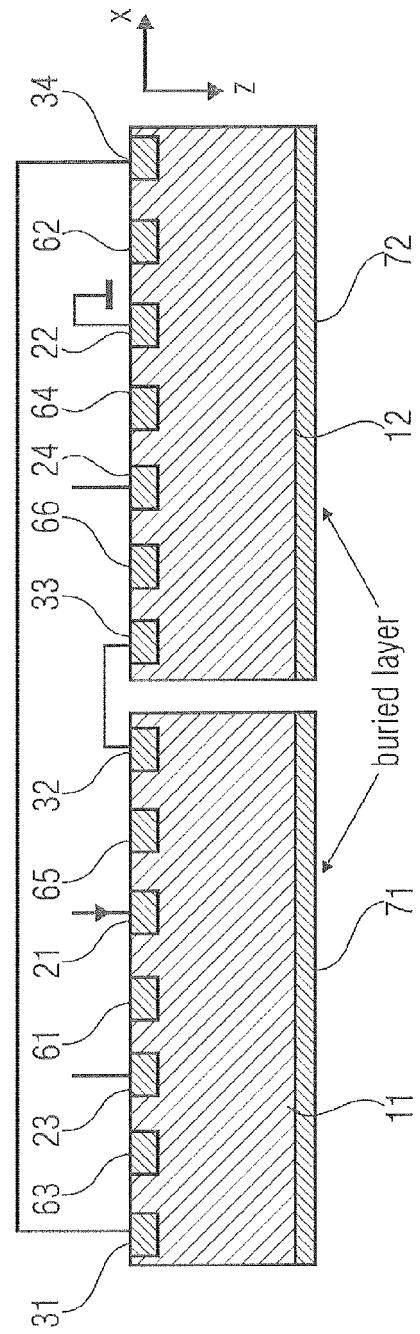

plan view plan view

FIG 22 plan view
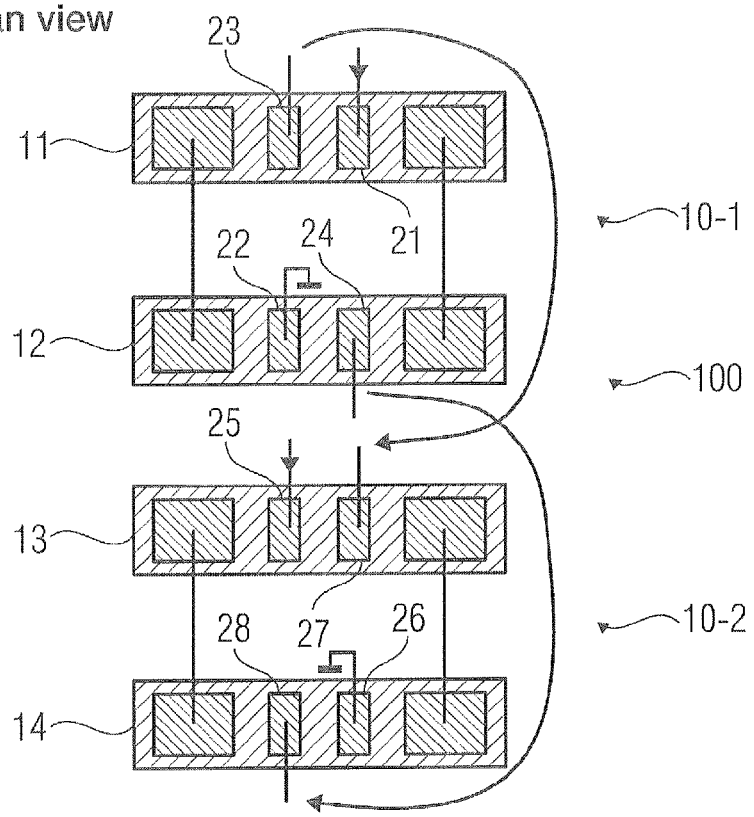
FIG 23 plan view
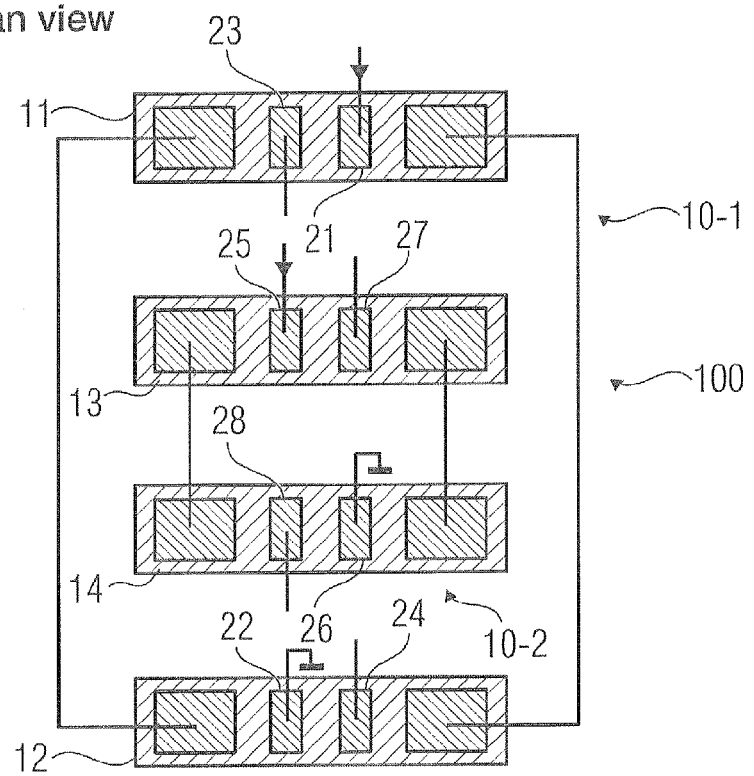

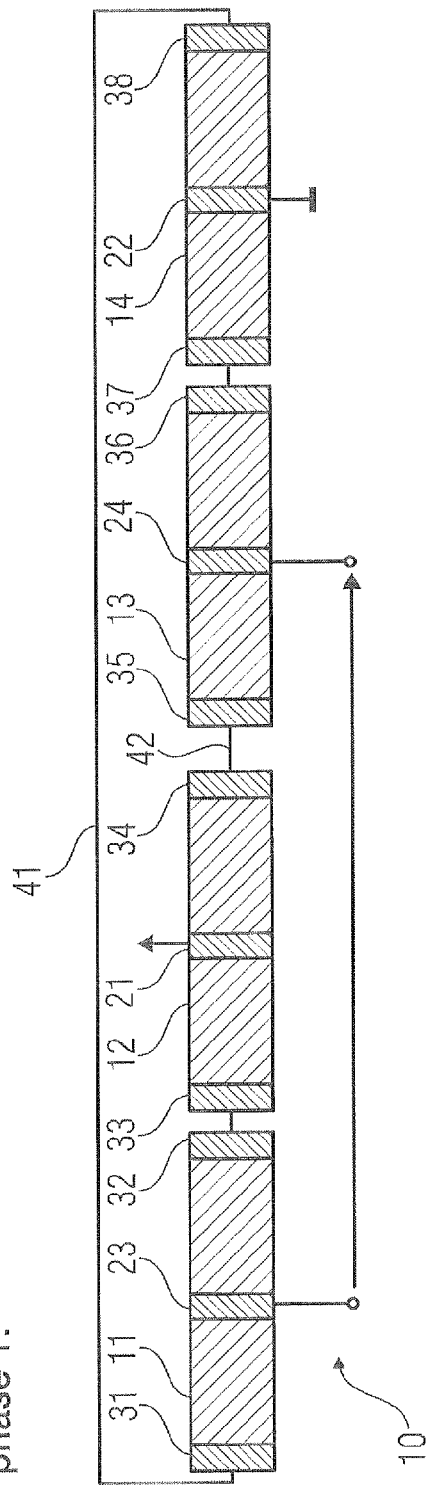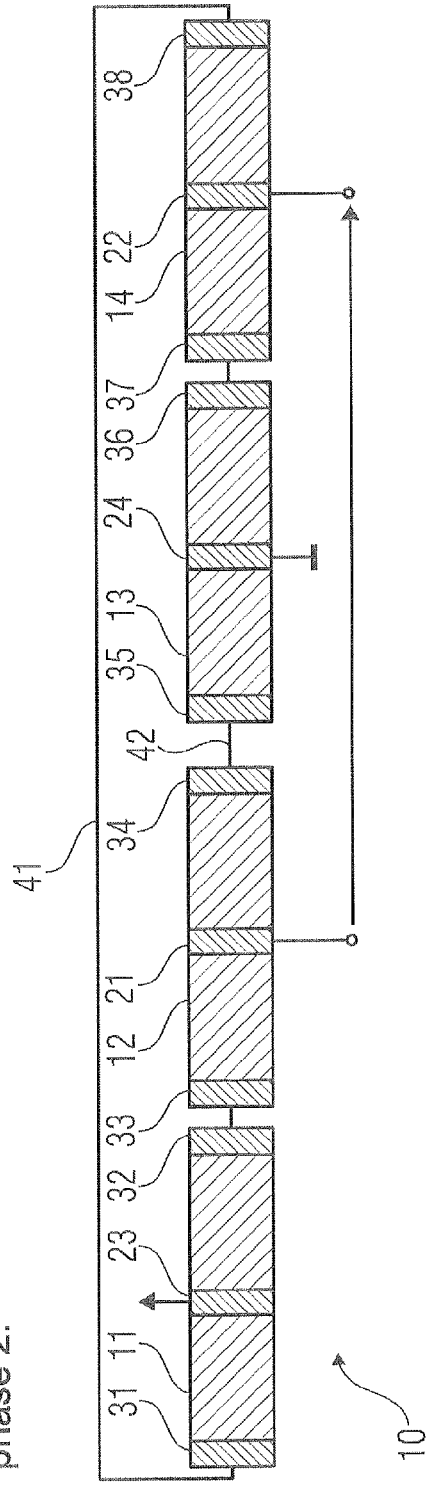
FIG 24

ELECTRONIC DEVICE WITH RING-CONNECTED HALL EFFECT REGIONS

RELATED APPLICATION

This application is a Continuation patent application of U.S. patent application Ser. No. 13/187,935 filed with the USPTO on Jul. 21, 2011 in the name of Udo Ausserlechner entitled "Electronic Device with Ring-Connected Hall Effect Regions" and is hereby incorporated in its entirety.

FIELD OF THE INVENTION

Embodiments of the present invention relate to an electronic device and to a sensing method. In particular, the electronic device may be a sensing device for sensing a physical quantity such as a magnetic field or a mechanical stress within an object.

BACKGROUND OF THE INVENTION

Electronic devices may be used to sense or measure physical quantities. In order to sense or measure the strength and direction of a magnetic field parallel to the surface of, e.g., a semiconductor die, vertical Hall devices may be used. Most vertical Hall devices suffer from the fact that the spinning current method, which is used to cancel the zero-point error of the Hall devices, does not work very well. With known methods of the spinning current scheme it is possible to obtain residual zero point errors of about 1 mT. A reason for this rather poor offset behavior can be found in the asymmetry of the vertical Hall device. Although it is known how to connect four vertical Hall devices in order to improve the symmetry, the contact resistances still cause residual asymmetries.

Another physical quantity that may be sensed or measured is mechanical stress within an object such as a substrate, in particular a semiconductor substrate. To this end, an electronic device may be used that has a similar structure as a Hall device. Indeed, it may suffice to slightly modify some internal connections of a suitable Hall device in order to obtain a mechanical stress sensor.

SUMMARY OF THE INVENTION

Embodiments of the present invention provide an electronic device comprising a number of n Hall effect regions with n>1, wherein the n Hall effect regions are isolated from each other. The electronic device comprises at least eight contacts in or on surfaces of the n Hall effect regions. The contacts comprise a first and a second contact of each Hall effect region. A first contact of the (k+1)-th Hall effect region is connected to the second contact of the k-th Hall effect region for k=1 to n−1, and the first contact of the first Hall effect region is connected to the second contact of the n-th Hall effect region. The at least eight contacts comprise at least two supply contacts and at least two sense contacts. Each Hall effect region comprises at most one of the at least two supply contacts. Furthermore, each Hall effect region comprises at most one of the at least two sense contacts.

Further embodiments of the present invention provide an electronic device comprising a first electronic device and a second electronic device as defined above, a sense signal evaluator configured to be connected to a sense contact of the first electronic device and to a sense contact of the second electronic device. The sense signal evaluator is further configured to process a differential sense signal that is based on first and second sense signals provided at the sense contacts.

Further embodiments of the present invention provide an electronic device comprising: a first Hall effect region, a second Hall effect region, a third Hall effect region, and a fourth Hall effect region that are isolated from each other. Each Hall effect region comprises a first contact, a second contact, a supply contact, and a sense contact in or on surfaces of the Hall effect region. The first contact of the second Hall effect region is connected to the second contact of the first Hall effect region and the first contact of the first Hall effect region is connected to the second contact of the second Hall effect region, so that two current paths exist between the supply contact of the first Hall effect region and the supply contact of the second Hall effect region. The first contact of the fourth Hall effect region is connected to the second contact of the third Hall effect region and the first contact of the third Hall effect region is connected to the second contact of the fourth Hall effect region, so that two current paths exist between the supply contact of the third Hall effect region and the supply contact of the fourth Hall effect region. The supply contacts and the sense contacts are arranged in a sequence along each one of the current paths such that there is one sense contact of the sense contacts between two of the supply contacts. A first differential sense signal is tapped between the sense contacts of the first and third Hall effect regions and a second differential sense signal is tapped between the sense contacts of the second and fourth Hall effect regions.

Further embodiments of the present invention provide an electronic device, comprising: four Hall effect regions that are isolated from each other, wherein each of the four Hall effect regions comprises a first contact and a second contact in or on a surface of the Hall effect region. A first contact of the (k+1)-th Hall effect region is connected to a second contact of the k-th Hall effect region for k=1 to 3, and a first contact of the first Hall effect region is connected to a second contact of the fourth Hall effect region. Each of the four Hall effect regions further comprises one of a supply contact and a sense contact in or on the surface of the Hall effect region, the supply contact or the sense contact being arranged between the first contact and the second contact of the Hall effect region. A Hall effect region in or on the surface of which a supply contact is formed is connected via its first and second contacts to two Hall effect regions in or on the surfaces of which a sense contact is formed, respectively, so that the supply contacts and the sense contacts are arranged in a sequence along a current path between at least two supply contacts such that there is one sense contact between the at least two supply contacts. Each Hall effect region comprises at most one of the at least two supply contacts.

Further embodiments according to the teachings disclosed herein provide an electronic device comprising a first Hall effect region and a second Hall effect region, at least four spinning current contacts, and at least four ring-contacting contacts. The first and second Hall effect regions are isolated from each other. At least one contact of the at least four spinning current contacts is formed in or on a surface of each of the first and second Hall effect regions and configured to function as a supply contact and a sense contact during different operating phases of a spinning current scheme. Two of the at least four ring-contacting contacts are formed in or on the surface of the first Hall effect region and two of the at least four ring-contacting contacts are formed in or on the surface of the second Hall effect region. The at least four ring-contacting contacts are pair-wise electrically connected via two connections other than the first and second semiconductor Hall effect regions, thus forming at least two pairs. Each pair comprises one ring-contacting contact of the first Hall effect region and one ring-contacting contact of the second Hall effect region so that the first Hall effect region and the second Hall effect region are electrically connected in a ring-like manner. The at least four ring-contacting contacts and the two connections are configured so that a total current fed to a supply contact of the first Hall effect region and extracted at another supply contact at the second Hall effect region is divided in two substantially equal parts flowing via the two connections.

Furthermore, embodiments of the present invention provide a sensing method, comprising: connecting a power supply between a first supply contact formed in or on the surface of a first Hall effect region and a second supply contact formed in or on the surface of another Hall effect region, the first Hall effect region and the other Hall effect region being part of a number of n Hall effect regions, wherein a first contact of the (k+1)-th Hall effect region is connected to a second contact of the k-th Hall effect region for k=1 to n−1, and the first contact of the first Hall effect region is connected to the second contact of the n-th Hall effect region so that an electric current provided by the power supply flows via two current paths from the first supply contact to the second supply contact.

The method further comprises sensing sense signals at a first sense contact formed in or on the surface of one of the n Hall effect regions and at a second sense contact formed in or on a surface of another one of the n Hall effect regions, wherein each Hall effect region comprises at most one of the at least two sense contact. Further, the method comprises swapping temporary functions of the first supply contact and the first sense contact and swapping temporary functions of the second supply contact and the second sense contact so that the power supply is subsequently connected between the former first sense contact and the former second sense contact, wherein the electric current flows from the former first sense contact to the former second sense contact via the n Hall effect region. Lastly, the method includes sensing sense signals at the former first and the former second supply contacts, and determining an output signal based on sense signals at the first sense contact, the second sense contact, the former first supply contact, and the former second supply contact.

BRIEF DESCRIPTION OF THE DRAWINGS

Embodiments of the present invention are described herein, making reference to the appended drawings.

FIG. 2 shows a schematic cross-section through an electronic device similar to the electronic device shown in FIG. 1;

FIG. 3 shows a schematic cross-section through an electronic device according to a further embodiment of the teachings disclosed herein;

FIG. 4 shows a schematic cross-section through an electronic device according to yet another embodiment of the teachings disclosed herein;

FIG. 5 shows a schematic cross-section through an electronic device according to a further embodiment of the teachings disclosed herein;

FIG. 22 shows a schematic plan view of an electronic device according to an embodiment comprising four Hall effect regions arranged in a column;

FIG. 23 shows a schematic plan view of an electronic device according to another embodiment comprising four Hall effect regions arranged in a column;

FIG. 24 shows two schematic plan views of an electronic device according to an embodiment of the teachings disclosed herein during a first phase and a second phase of a measuring cycle, the electronic device comprising four Hall effect regions, each having a single spinning current contact;

Figure 1:
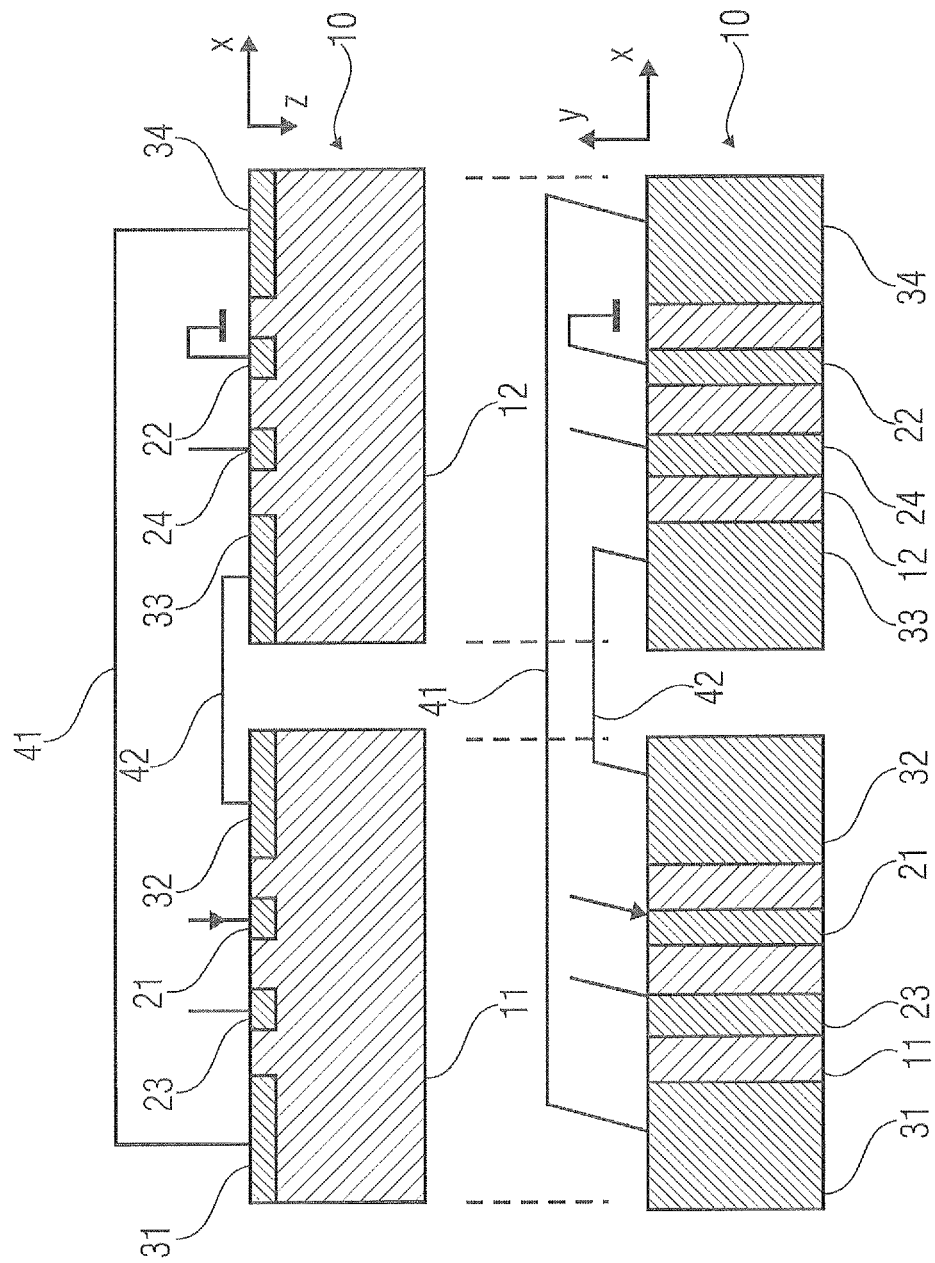
FIG. 1 shows a schematic cross-section through an electronic device and a corresponding plan view of the electronic device according to an embodiment of the teachings disclosed herein.

Equal or equivalent element or elements with equal or equivalent functionality are denoted in the following description by equal or similar reference signs.

DETAILED DESCRIPTION

In the following description, a plurality of details are set forth to provide a more thorough explanation of embodiments of the teachings disclosed herein. However, it will be apparent to one skilled in the art that embodiments of the teachings disclosed herein may be practiced without these specific details. Features of the different embodiments described hereinafter may be combined with each other, unless specifically noted otherwise. For the most part, the terms "Hall effect region" and "tub" are used interchangeably herein. Accordingly, a Hall effect region may be a tub or well of a first conductivity type which is embedded in a substrate or a tub of opposite conductivity type. This structure may cause an electrical isolation of the tub against the substrate in particular if the resulting pn-junction is reverse biased. However, it may also be possible that one tub comprises two or more Hall effect regions, in particular when two or more relatively distinct current flows can be created within the Hall effect region (thus effectively providing some sort of isolation of the two Hall effect regions).

When the electronic device comprises two or more Hall effect regions, these may be isolated from each other. The electrical isolation of two Hall effect regions against each other may take several forms. According to a first form of isolation, the two or more Hall effect regions are disjoined from each other, i.e., two adjacent Hall effect regions do not merge at one or more locations but are separated by a material other than the Hall effect region material. As one possible option, the tub may be isolated in lateral direction by means of trenches that are typically lined and/or filled with a thin oxide. As another option, the tub may be isolated towards the bottom by means of an SOI (silicon on insulator) structure. Although the tub typically has a single conductivity type it may be advantageous to configure the doping concentration in an inhomogeneous manner, i.e. spatially variable. In this manner a high concentration of the doping agent may occur in the area of the contacts, as is usual with deep CMOS tub contacts. In the alternative, a layering of differently strongly doped layers may be sought after, as is the case with e.g. a buried layer. Such a layering may result, to some extent, from technological reasons relative to other electronic structures that are formed within the substrate. The design of the electronic device, the Hall device, or the mechanical stress sensor then may need to be reconciled with these circumstances, even though the layering may in fact be unfavorable for the electronic device, the Hall device, or the mechanical stress sensor.

Another form of isolation may be achieved by measures that reduce or substantially prevent an electric current from flowing in one or more subregions of a tub or well. For example, the electric current may be offered an alternative current path that has lower ohmic resistance (possibly by several orders of magnitude) than a substantially parallel current path would have that goes through the tub. The current path having the lower ohmic resistance may be a conductor formed in or on the surface of the tub.

In one embodiment, the Hall effect region may be an n-doped semiconductor as this provides a three times higher mobility and consequently a higher Hall factor than with a p-doped semiconductor. The doping concentration in the functional part of the Hall effect region in one embodiment is typically in the range of $10^{15}$ cm$^{-3}$ to $10^{17}$ cm$^{-3}$.

Another possible material for the Hall effect regions is permalloy which is a nickel-iron magnetic alloy, or a material similar to permalloy. Permalloy exhibits a low coercivity, near zero magnetostriction, high magnetic permeability, and significant anisotropic magnetoresistance. A variation of the electrical resistance of permalloy within a range of approximately 5% can typically be observed depending on the strength and the direction of an applied magnetic field. This effect may be used in a similar manner as the Hall effect occurring in a semiconductor for sensing and/or measuring a magnetic field, and is known in the literature as the anomalous Hall effect.

The teachings disclosed herein are related to the use of the spinning current principle, in which supply- and sense-terminals are exchanged in consecutive clock phases/operating phases. A sense terminal in a vertical Hall device responds to an electric current passing underneath it. A magnetic field (parallel to the die surface and perpendicular to the current streamlines) can efficiently lift up or pull down the potential at the contact (which typically is at the surface of the die). The term "vertical Hall effect" or "vertical Hall device" may be thought of as being derived from the fact that the Hall effect in a vertical Hall device acts in a vertical direction (if the surface of the substrate is assumed to be horizontal, per definition). Contacts at the end of a tub (or semiconductor Hall effect region) typically are not, or only negligibly, subject to current streamlines passing underneath them. Therefore, contacts at the ends of a tub typically are less frequently used as sense contacts. Besides a classification of Hall devices in "horizontal Hall devices" and "vertical Hall devices" they may also be distinguished regarding the direction in which the current flows in a region where it experiences the Hall effect. In a Hall device using the "vertical current mode", the electric current substantially flows in a vertical direction with respect to the surface (which is assumed to be horizontal). In a Hall device using the "horizontal current mode", the electric current substantially flows in a horizontal direction, i.e., parallel to the (horizontal) substrate surface, at least in a region where the Hall effect acts on the electric current and can be sensed. The electronic devices according to the teachings disclosed herein typically (but not necessarily) use a substantially horizontal current mode. According to the disclosed teachings it is proposed that the electrical equivalent of the device is an electrical ring. In this way it can be avoided that the distance of the supply contacts to the end of the Hall effect region changes in a significant manner during a spinning clock cycle because a ring does not have an outer edge.

As it is described in the abstract, an electronic device comprises a number of n Hall effect regions with n>1, wherein the n Hall effect regions are isolated from each other. The electronic device also comprises at least eight contacts in or on a surface of the n Hall effect regions, wherein the contacts comprise a first and a second contact of each Hall effect region. A first contact of the (k+1)-th Hall effect region is connected to the second contact of the k-th Hall effect region for k=1 to n−1, and the first contact of the first Hall effect region is connected to the second contact of the n-th Hall effect region. The at least eight contacts comprise at least two supply contacts and at least two sense contacts. Each Hall effect region comprises at most one of the at least two supply contacts and at most one of the at least two sense contacts.

The Hall effect regions are formed in an isolated manner from each other (for example in the same substrate, having an insulating structure or at least a substantially current-free region between them, or in two distinct substrates) but galvanically connected to a ring thus forming a ring structure. An electric current enters the ring structure at a first supply contact and leaves the ring structure at a second supply contact. Due to the ring structure, two current paths are available for the electric current between the first supply contact and the second supply contact. The two current paths begin at the first supply contact and join together at the second supply contact. Typically it will be aimed-at that the two current paths are substantially equal or symmetrical with respect to their electric properties such as resistance, capacitance, inductance, etc. The electric current will branch into two substantially equal partial currents, if the two current paths are substantially equal or symmetrical. The term "ring" thus describes the topology of the current flow. In order to make a roundtrip along the ring, one would first follow the first current path from the first supply contact to the second supply contact. Then one would follow the second current path from the second supply contact back to first supply contact. Note that on the second leg of the roundtrip the direction of travel is opposite to the direction of current flow, which is in accordance with the definition of a ring structure according to the disclosed teachings.

A spinning current scheme may be used in particular in case the electronic device is a vertical Hall effect device. During the execution of one cycle of the spinning current scheme, a first ring is formed during a first operating phase of the spinning current cycle, and a second ring is formed during a second operating phase of the spinning current cycle. The two rings of the two operating phases differ in particular with respect to the contacts where the electric current enters and leaves the ring. In each operating phase at least six contacts are typically within the ring: the two supply contacts and four ring-contacting contacts which serve to connect the n (i.e., two or more) Hall effect regions to each other. With respect to any sense contacts that are formed in or on the surface of the Hall effect regions it can be said that, although a main purpose of the sense contacts is not to be traversed by the electric current, they nevertheless influence the current flow through the substrate. Indeed, as the sense contacts typically have a lower resistance than the surrounding substrate, a portion of the electric current may actually flow through the sense contacts in a transverse manner.

The proposed ring connection differs from a parallel connection of two or more Hall effect regions as explained in the following. In a parallel connection two or more nodes of one Hall effect region are electrically connected to two or more corresponding nodes of the other Hall effect region. In this manner, the electric potential at these nodes is aligned between the two or more Hall effect regions. The two or more Hall effect regions of a parallel connected configuration are not part of a common main current path, i.e. an electric current fed to the first Hall effect region at a first supply contact does not mainly flow through the second Hall effect region, but typically leaves the first Hall effect region at a second supply contact with substantially the same magnitude. By contrast, in the ring connection which is proposed herein a total electric current is split into two (substantially equal) parts within one of the Hall effect regions, i.e. the Hall effect region in which or on the surface of which the first supply contact is currently formed. The parts of the total electric current flow to at least one other Hall effect region. Subsequently, the parts of the total electric current flow through the at least one other Hall effect region and eventually join together just before leaving the ring structure at the second supply contact. In this manner, the part of the total electric current that leaves one of the Hall effect regions via the first contact or the second contact of the Hall effect region enters the other Hall effect region so that both Hall effect regions see the same part of the total electric current at the contact via which the connection is made.

In some configurations a conductive region, such as an n+ buried layer (nBL), may be present adjacent to a second surface of the Hall effect regions opposite to the first surface. According to the teachings disclosed herein, the contacts that are formed in the first surface(s) or on the first surface(s) of the Hall effect region(s) are electrically separated from the conductive region. In particular, no low-ohmic connection, such as one or more n+ sinker(s), exists between one of the at least eight contacts and the conductive region (e.g., the nBL). Rather, the contacts and the conductive region are separated by at least a portion of the relatively high-ohmic Hall effect region. In other words, an electrical connection between one of the at least eight contacts and the conductive region traverses the corresponding Hall effect region or a portion thereof (typically in a vertical direction).

FIG. 1 shows a schematic cross-section through an electronic device 10 according to an embodiment of the teachings disclosed herein and, below the schematic cross section, a schematic plan view of the same electronic device. The electronic device 10 comprises a first Hall effect region 11 and a second Hall effect region 12. The Hall effect regions 11 and 12 may be formed in a semiconductor substrate by locally doping the semiconductor substrate to obtain e.g. an n-type semiconductor material (an n-type semiconductor has more electrons than holes). A supply contact 21 and a sense contact 23 are formed on a surface of the first Hall effect region 11. A supply contact 22 and a sense contact 24 are also formed on a surface of the second Hall effect region 12. The supply contacts 21, 22 and the sense contacts 23, 24 are spinning current contacts that are configured to function as supply contacts during a first operating phase of a spinning current cycle and to function as sense contacts during a second operating phase of the spinning current cycle, or vice versa. FIG. 1 depicts the electronic device in a configuration corresponding to a first clock phase of the spinning current cycle. An electric current enters the first Hall effect region 11 at the spinning current contact 21 (first supply contact) and leaves the second Hall effect region 12 at the spinning current contact 22 (second supply contact) that is, in the depicted configuration, connected to a ground potential. The two spinning current contacts 23 and 24 are configured to function as sense contacts during the first clock phase. In a second clock phase, the two spinning current contacts 23 and 24 are configured to function as supply contacts and the previous supply contacts 21 and 22 are configured to function as sense contacts. Therefore it may be advantageous to have a high degree of symmetry between contacts 21 and 23 as well as between contacts 22 and 24.

The electronic device 10 shown in FIG. 1 further comprises four ring-contacting contacts 31, 32, 33, and 34. In other parts or text passages of the present disclosure, the ring-contacting contacts are also referred to as "first contact" and "second contact" of a corresponding Hall effect region. The ring-contacting contacts 31 and 34 are electrically connected by means of an electrically conducting connection 41. The ring-contacting contacts 32 and 33 are electrically connected to each other by means of another electrically conducting connection 42. In this manner, the two Hall effect regions 11 and 12 are connected in a ring-like manner. The ring-contacting contacts are distinct from the spinning current contacts. In FIG. 1, the ring-contacting contacts 31 to 34 are located closer to an end of one of the Hall effect regions 11, 12 than the spinning current contacts 21 to 24. This causes the electric current input at the spinning current contact 21 during the first clock phase to flow along a first current path of the ring and along a second current path of the ring until it leaves the ring at the spinning current contact 22. Another observation that can be made is that the electric current enters and leaves the two Hall effect regions 11, 12 at the same contacts where it enters and leaves the electrical ring structure. In other words, the electric current flowing through the electronic device between the two supply contacts 21, 22 is conducted along the ring structure. Typically, there are two conducting paths (current paths) between the two supply contacts 21 and 22 and the electric current will assume a current distribution corresponding to the resistances of the two conducting paths. The first conducting path leads from the supply contact 21 to the right, via the ring-contacting contacts 32 and 33 and connection 42 to the second semiconductor region 12, beneath (and possibly partly through) the sense contact 24 and finally to the supply contact 22. The second conducting path leads from the supply contact 21 to the left, beneath (and possibly partly through) sense contact 23, via the ring-contacting contacts 31 and 34 and the connection 41 to the second Hall effect region 12 and finally to the supply contact 22. The first conducting path and the second conducting path each comprise sections traversing the Hall effect regions 11, 12. In the embodiment shown in FIG. 1, the total lengths of the sections within the first and second Hall effect regions are approximately equal for the first and second conducting paths. The connections 41 and 42 may be relatively low ohmic compared to the Hall effect regions 11, 12. All this leads to a substantially balanced current distribution among the first and second conducting paths. Furthermore, the ring-contacting contacts 31 to 34 may be relatively large in order to make the connection to the ring low-ohmic and to reduce the voltage drop across the ring-contacting contacts 31 to 34. At least one of the two ring-contacting contacts may have a large effective surface for a low-ohmic connection between the at least one ring-contacting contact and the Hall effect region.

The electric currents flow in the same direction via the connections 41 and 42, i.e., from the first Hall effect region 11 to the second Hall effect region 12. The supply contact 21 at which the electric current enters the Hall effect regions 11, 12 is provided at the first Hall effect region 11, while the current supply contact at which the electric current leaves the Hall effect regions 11, 12 is provided at the second Hall effect region 12. The direction in which the current flows through the semiconductor Hall effect device regions 11, 12, where it enters, and where it leaves the electronic device is basically a design option and may be modified. Moreover, the direction of the current could be inversed e.g. during an optional third operating phase and an optional fourth operating phase of the spinning current scheme. One effect of the ring connection is that the electric current passes in opposite directions beneath the sense contacts 23, 24 so that, due to the Hall effect, the electrical potential at one of the sense contacts increases as a result of a magnetic field being present, while the electrical potential at the other sense contact decreases. However, the two sense contacts are at different common mode potentials. This means that (even) without a magnetic field being present the electrical potentials at the sense contacts 23 and 24 are generally not equal: The electrical potential at the sense contact 23 is closer to an electric potential of a positive pole of the power supply (which is connected to the supply contact 21), whereas the electrical potential at the sense contact 24 is closer to the ground potential (which is connected to the supply contact 22).

The first and second Hall effect regions may be symmetrical with respect to a symmetry axis or a symmetry plane. The two ring-contacting contacts of the first Hall effect region and the two ring-contacting contacts of the second Hall effect region may be symmetrical with respect to the symmetry axis or the symmetry plane, as well. In FIG. 1 for example, a first symmetry axis or symmetry plane for the electronic device may be located between the first Hall effect region 11 and the second Hall effect region 12, and a second symmetry axis or symmetry plane for only the Hall effect region 11 may be located between contacts 21 and 23. With respect to the symmetry of the electronic device 10, it should be noted that it may typically not be necessary to distinguish between supply contacts and sense contacts, as these typically are only temporary functions of the corresponding spinning current contacts. Rather, for the purpose of assessing a symmetry of the electronic device, a distinction may typically be made between spinning current contacts and ring-contacting contacts.

As can be seen in FIG. 1 and some of the subsequent Figures, the first and second Hall effect regions 11, 12 may be disposed along a line. The line may extend along the longitudinal axes of the first and second Hall effect regions 11, 12 so that the longitudinal axes substantially coincide. The first and second semiconductor Hall effect devices are in this case longitudinally offset. Hence, the first end of the first Hall effect region 11 and the second end of the second Hall effect region 12 are exterior ends and the second end of the first Hall effect region 11 and the first end of the second Hall effect region 12 are interior ends with respect to the electronic device structure.

The electronic device 10 shown in FIG. 1 comprises two Hall effect regions, i.e. n=2. The supply contact 21 of the at least two supply contacts 21, 22 is formed in or on the surface of the first Hall effect region 11 and the other supply contact 22 of the at least two supply contacts 21, 22 is formed in or on the surface of the second Hall effect region 22. Moreover, a sense contact 23 of the at least two sense contacts 23, 24 is formed in or on the surface of the first Hall effect region 11 and another sense contact 24 of the at least two sense contacts 23, 24 is formed in or on the surface of the second Hall effect region 12.

In the electronic device 10 shown in FIG. 1 the first Hall effect region 11 comprises a first end and a second end. Likewise, the second Hall effect region 12 comprises a first end and a second end. The first contacts 31, 33 and the second contacts 32, 34 are closer to one of the first end and the second end of a corresponding one of the first and second Hall effect regions 11, 12, than the any one of the supply contacts 21, 22 and the sense contacts 23, 24 (during the first operating phase).

Another way to describe the electronic device 10 depicted in FIG. 1 is as follows: The electronic device comprises two Hall effect regions 11, 12. In the first Hall effect region 11, or on a surface thereof, at least one inside contact (or inner contact or interior contact) is formed. In the embodiment shown in FIG. 1, two inside contacts 21, 23 are formed on the surface of the first Hall effect region 11. The second Hall effect region 12 also comprises at least one inner contact, and in particular two inner contacts 22, 24 that are formed at the surface of the second Hall effect region 12. The inner contacts 21 to 24 are configured to function as supply contacts and, in an alternating manner, as sense contacts. The inner contacts 21 to 24 belong to at least four spinning current contacts of which at least one contact is formed in or on the surface of the first and second Hall effect regions. The inner contacts 21 to 24 are configured to function as a supply contact and a sense contact during different operating phases of the spinning current scheme. Furthermore, the first Hall effect region 11 comprises two margin contacts 31, 32. The second Hall effect region 12 comprises two other margin contacts 33, 34. The margin contacts 31 to 34 belong to at least four ring-contacting contacts (also designated as first contact and second contact of a Hall effect region), two of which are formed in or on the surface of the first Hall effect region and two of which are formed in or on the surface of the second Hall effect region. The connections 41 and 42 connect the two margin contacts belonging to different Hall effect regions in a pair-wise manner, i.e. connection 41 connects the margin contacts 31 and 34 whereas connection 42 connects the margin contacts 32 and 33. Thus, each pair comprises one ring-contacting contact of the first Hall effect region and one ring-contacting contact of the second Hall effect region so that the first and second Hall effect regions are electrically connected in a ring-like manner. The at least four ring-contacting contacts and the two connections are configured so that a total current fed to a supply contact of the first Hall effect region and extracted at another supply contact at the second Hall effect region (or vice versa) is divided in two substantially equal parts (with respect to magnitude) flowing via the two connections. The terms "margin contact" and "inside contact" refer to the relative position of the contacts that are arranged in or on the surface of the Hall effect regions 11 and 12: an "inside contact" typically has at least two neighbors, for example, either (i) two other inside contacts, or (ii) two margin contacts, or (iii) one other inside contact and one margin contact. A margin contact is typically located closer to a particular end of the Hall effect region at hand than any other contact and typically has only one neighboring inside contact.

FIG. 2 shows a schematic cross-section through an electronic device 2 according to an embodiment of the teachings disclosed herein. A corresponding plan view can be readily derived from the schematic cross-section in FIG. 2 in an analogous manner as in FIG. 1. The two Hall effect regions 11 and 12 are arranged within a single long tub with large outer contacts 31, 34 and one large contact 32 in the center. Although in a single tub, the two Hall effect regions may be regarded as being isolated from each other, in particular when considering the manner in which an electric current flows through the tub. The large contact 32 may have a lower resistance than the tub so that a vast majority of the electric current effectively flows through the contact 32, in particular if the contact 32 is relatively long and if no n+ buried layer (nBL) is present. Under this definition, the two Hall effect regions 11, 12 are isolated although they are physically merged as one large tub. In other words, a low-ohmic path is offered in the form of the contact 32 (corresponding to the contacts 32, 33 and the connection 42 in FIG. 1) for the electric current, causing the electric current to substantially avoid the tub beneath the contact 32 (thus creating a substantially current-free region) that achieves an effective isolation of the left and right tub portions. Typically, the longer the contact 32 is in the x-direction, the better the electric isolation (according to the definition given above) between the left and right tubs. The spinning current contacts 21 to 24 are connected in a manner corresponding to the first clock phase of the spinning current cycle. Compared to the embodiment shown in FIG. 1 the electronic device 2 shown in FIG. 2 has slightly reduced symmetry, yet uses up less space. The reason for the slightly reduced symmetry is that one of the two conducting paths along the ring structure comprises an external connection in the form of the connection 41, while the other conducting path is closed by merging the two ring-contacting contacts 32, 33 shown in FIG. 1 to a single ring-contacting contact 32 in FIG. 2. The length of the ring-contacting contacts 31, 32 and 34 should be larger than the depth of the well, i.e. the Hall effect region 11. The center ring-contacting contact 32 typically has a higher electrical conductivity than the material within the Hall effect region 11 so that the electric current flowing from the supply contact 21 to the supply contact 22 flows mostly within the ring-contacting contact 32 instead of beneath it. The first Hall effect region 11 and the second Hall effect region 12 substantially merge at one of their first ends and second ends, respectively. In the present case, the first and second Hall effect regions 11 and 12 merge at their ends that are facing each other in FIG. 1. The first ring-contacting contact 32 formed in or on the surface of the first Hall effect region 11 and the corresponding first ring-contacting contact 33 formed in or on the surface of the second semiconductor Hall effect region 12 merge as well. Alternatively, the large contact 32 depicted in FIG. 2 could be divided into two smaller contacts 32, 33 similar to the ones illustrated in FIG. 1. These two smaller contacts could then be connected by means of a wire, i.e., the connection 42. This means that the configuration of FIG. 1 is only slightly modified by approaching the Hall effect regions 11 and 12 to each other until they merge. The contacts 32 and 33 are, however, slightly retracted from the end of the Hall effect regions 11, 12 so that the contacts 32, 33 do not merge. The resulting electronic device would have a better symmetry than the one shown in FIG. 2 as the current from the Hall effect region has to flow via the connections 41 and 42. The larger a spacing between the contacts 32 and 33, the better the isolation between the left and right tub portions.

FIG. 3 shows a schematic cross-section through an electronic device 10 according to a further embodiment of the teachings disclosed herein. A corresponding plan view can be readily derived from the schematic cross-section in FIG. 3 in an analogous manner as in FIG. 1. In contrast to the embodiment shown in FIG. 1 the ring-contacting contacts 31 to 34 (which are also called first and second contacts elsewhere) are not flush with ends of the tubs 11, 12. The two ring-contacting contacts, e.g. ring-contacting contacts 31 and 32 or 33 and 34 or all four contacts 31 to 34 of at least one of the first and second Hall effect regions 11, 12 are disposed at a distance from the first end and the second end of the Hall effect region in or on the surface of which they are formed. In the electronic device 2 shown in FIG. 2, the outer contacts 31 and 34 also are not flush with the ends of the tub 11, but they could be. By moving the ring-contacting contacts 31 to 34 slightly away from the ends of the Hall effect region(s) 11, 12, boundary effects acting on the current distribution within the Hall effect region(s) 11, 12 can be expected to be reduced. The boundary effects may be different at a first end and a second end due to fabrication inaccuracies, thus being a potential source for asymmetry. Especially when the Hall effect regions 11, 12 are formed by means of locally doping a semiconductor substrate, the ends of the Hall effect regions 11, 12 may be subject to manufacturing tolerances that may possibly affect the current distribution. Due to the non-linear voltage-current relationship in semiconductors these asymmetries may lead to residual offset of the spinning current principle. By residual offset we mean that the combination of measured output voltages in respective operating phases of the spinning current sequence is not entirely free of zero-point error. Therefore asymmetries in the electronic device should be reduced as much as possible.

FIG. 4 shows a schematic cross-section through an electronic device 10 according to another embodiment of the teachings disclosed herein. A corresponding plan view can be readily derived from the schematic cross-section in FIG. 4 in an analogous manner as in FIG. 1. At least one of the two ring-contacting contacts (or margin contacts) 31, 32, 33, 34 per Hall effect region 11, 12 comprises two or more contact sections separated by an interstice. In the embodiment according to FIG. 4, the large contacts 31 to 34 shown in FIGS. 1 to 3 have been replaced with several smaller ones that are partly floating or shorted by wires. The several smaller contacts are typically separated by an interstice or a gap that may be filled with oxide according to state of the art in modern CMOS/BiCMOS processes or similar technologies. Thus, the large contacts shown in the previous FIGS. 1 to 3 have been split up into several smaller ones that are either partly floating or shorted with wires. The electronic device 10 of FIG. 4 comprises two short-circuited ring-contacting contacts 31 near a first end of the first Hall effect region 11, two short-circuited ring-contacting contacts 32 near a second end of the first Hall effect region 11, two short-circuited ring-contacting contacts 33 near a first end of the second Hall effect region 12, and two short-circuited ring-contacting contacts 34 near a second end of the second Hall effect region 12. Furthermore, the electronic device 10 comprises a plurality of floating contacts 51, 52, 53, and 54, that may be considered to be a part of the ring-contacting contacts (or the margin contacts) 31 to 34. The floating contacts 51 to 54 are located at the surface of one of the two Hall effect regions 11, 12 between one of the ring contacting contacts 31 to 34 and an end of said one of the two Hall effect regions 11, 12 that is closest to the ring-contacting contact in question. The floating contacts may cause the current distribution within the Hall effect region to be more evenly distributed or uniform and hence to be more symmetrical. Additional floating contacts may also be placed between margin contacts and inner contacts or between inner contacts. They may be used to pull the current closer to the surface, which may be particularly advantageous if the semiconductor process has some highly conducting buried layer. The electronic device 10 may comprise at least one floating contact formed in or on the surface of at least one of the first and second Hall effect regions 11, 12.

The electronic device 10 may comprise an n$^+$-doped buried layer (nBL) that is not depicted in a majority of the Figures. Nevertheless, in general, any electronic device according to the teachings disclosed herein may comprise an n$^+$-doped buried layer, unless explicitly stated otherwise.

FIG. 5 shows a schematic cross-section through an electronic device according to a further embodiment of the teachings disclosed herein. A corresponding plan view can be readily derived from the schematic cross-section of FIG. 5 in an analogous manner as in FIG. 1. The electronic device 10 comprises a buried layer 71, 72 beneath the first and second Hall effect regions 11, 12. Floating contacts 61, 62, 63, 64, 65, and 66 are introduced to prevent an excessive amount of the current from flowing downwards into the buried layer 71, 72.

At the first Hall effect region 11 and starting from the left, the floating contact 63 is arranged between the ring-contacting contact 31 and the spinning current contact 23. The floating contact 61 is arranged between the spinning current contact 23 (sense contact) and the spinning current contact 21 (supply contact). The floating contact 65 is arranged between the spinning current contact (supply contact) 21 and the ring-contacting contact 32.

At the second semiconductor Hall effect region 12 and starting from the left, the floating contact 66 is arranged between the ring-contacting contact 33 and the spinning current contact (sense contact) 24. The floating contact 64 is arranged between the spinning current contact 24 (sense contact) and the spinning current contact 22 (supply contact). The floating contact 62 is arranged between the spinning current contact (supply contact) 22 and the ring-contacting contact 34.

During the first operating phase, the two current supply contacts 21 and 22 are located in two different Hall effect regions. The same is true for the two supply contacts 23 and 24 during the second operating phase. An advantage of this configuration becomes apparent when the Hall effect regions comprise, or are adjacent to, a buried layer: Each Hall effect region may have its own buried layer so that no direct short circuit is created via a common buried layer between the two supply contacts 21 and 22, or 23 and 24. In contrast, if both supply contacts 21 and 22, or 23 and 24 would be arranged at the same Hall effect region, or if two Hall effect regions share a common buried layer, a short circuit between the two supply contacts could occur via the buried layer: the buried layer would then typically be at an electrical potential approximately equal to half the supply voltage (referred to the negative power supply potential of the power supply). With the proposed structure of having the supply contacts in or on the surface of different Hall effect regions (and no common continuous buried layer), the short circuit is at least strongly reduced, because the buried layer of the Hall effect region connected to the positive power supply potential is pulled to approximately ⅔ of the supply voltage and the other buried layer of the other Hall effect region, which is connected to the negative power supply potential is pulled to approximately ⅓ of the supply voltage (both referred to the negative power supply potential of the power supply). Hence, the short circuit effect of the buried layer is reduced by separating the buried layer into two non-connected buried layers. Typically, one tries to avoid the short circuit via the buried layer as such a short circuit consumes much current, yet only contributes little to the Hall effect.

Figure 6:
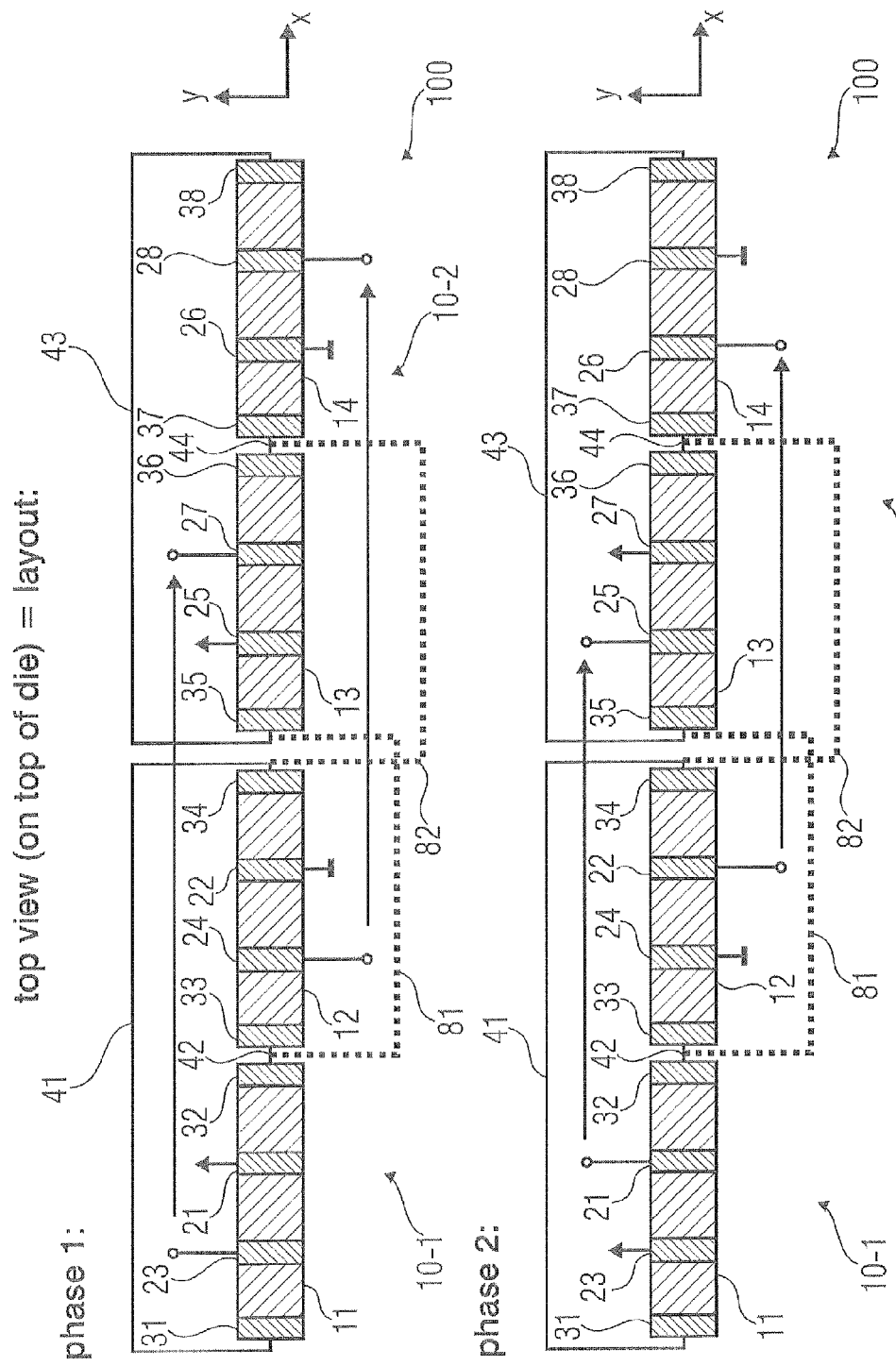
FIG. 6 shows two schematic plan views of an electronic device according to a further embodiment of the teachings disclosed herein during a first phase and a second phase of a measuring cycle, the electronic device comprising four Hall effect regions.

FIG. 6 shows two schematic top or plan views of an electronic device 100 according to a further embodiment of the teachings disclosed herein during a first phase (top) and a second phase (bottom) of a measuring cycle, the electronic device 100 comprising four Hall effect regions 11, 12, 13, 14. Corresponding cross section views can be readily derived from the schematic plan views in FIG. 6 in an analogous manner as in FIG. 1. This embodiment, among others, fulfils the following two requirements:

(1) A current is allowed to pass underneath a sense contact. Accordingly, a magnetic field (parallel to the die surface and perpendicular to the current streamlines) can efficiently lift up or pull down the electric potential at the sense contact (which is at the surface of the die).

(2) The electrical equivalent of the device is an electrical ring. Thus it is avoided, or at least reduced, that the distance of outmost supply contacts to the end of the device changes during a spinning current clock cycle.

As can be seen in FIG. 6, the electronic device 100 further comprises a third Hall effect region 13 and a fourth Hall effect region 14 that are electrically connected in a ringlike manner similar to the first Hall effect region 11 and the second Hall effect region 12. Actually, the first and second Hall effect regions 11, 12 and their associated contacts and connections form a first basic electronic device 10-1 corresponding to the one shown in FIG. 1 and described in connection therewith. Likewise, the third and fourth Hall effect regions 13, 14 and their associated contacts and connections form a second basic electronic device 10-2 similar to the one shown in FIG. 1. The difference between the first and second basic electronic devices 10-1, 10-2 is that in the second basic electronic device 10-2 (illustrated in the right half of FIG. 6) the supply contacts 25, 26 and the sense contacts 27, 28 are swapped when compared to the first basic electronic device 10-1 which is illustrated in the left half of FIG. 6. The first and second Hall effect regions 11, 12, associated spinning current contacts 21 to 24, and associated ring-contacting contacts 31 to 34 form a first ring structure. The third and fourth Hall effect regions 13, 14, associated spinning current contacts 25 to 28, and associated ring-contacting contacts 35 to 38 form a second ring structure. An output signal of the electronic 100 device is determined on the basis of a first electrical potential within the first ring structure or basic electronic device 10-1 (for example at the sense contact 23 during the first operating phase) and a second electrical potential within the second ring structure or basic electronic device 10-2 (for example at the sense contact 27 during the first operating phase). The configuration shown in FIG. 6 may be regarded as a longitudinal configuration.

The electronic device 100 shown in FIG. 6 has four tubs or Hall effect regions 11, 12, 13, and 14. The tubs 11 to 14 are isolated from each other. Each tub has four contacts: two outer contacts 31 and 32, 33 and 34, 35 and 36, 37 and 38 and two inner contacts 23 and 21, 24 and 22, 27 and 25, 28 and 26. The tubs are pairwise connected with wires 41, 42 and 43, 44, respectively, in an electrical ring shape via their outer contacts (ring-contacting contacts) 31 to 38. Both rings are isolated from each other. The upper picture illustrates how the electronic device 100 is connected to an electrical supply during a first clock phase of the spinning current cycle. In the left ring or first basic electronic device 10-1 (comprising the tubs 11 and 12) the supply terminals 21 and 22 are the right ones of the inner contacts and the sense terminals 23 and 24 are the left ones of the inner contacts. In the right ring or second basic electronic device 10-2 the supply terminals 25 and 26 are the left ones of the inner contacts and the sense terminals 27 and 28 are the right ones of the inner contacts. Thus the supply and sense terminals 21 to 28 are inner contacts whereas the tubs 11 to 14 are connected in a ring via the outer contacts 31 to 38—therefore the current may pass underneath each of the inner contacts 21 to 28, if it is currently used as the sense contact.

The two rings or basic electronic devices 10-1, 10-2 may be tied together with shorts 81 and 82, that are shown as broken lines: the outer contacts 31, 34 and 36, 37, that are closer to the ground terminals 22 and 26 in both basic electronic devices 10-1, 10-2 are connected. Similarly the outer contacts 32, 33 and 35, 38, that are closer to the supply terminals 21 and 25 in both basic electronic devices 10-1, 10-2 are connected. Thus, an electronic device 100 may further comprise at least one electrical cross connection between one of the ring-contacting contacts of first basic electronic device 10-1 and an equivalent ring-contacting contact of the ring-contacting contacts of the second basic electronic device 10-2. Note that as long as the devices are identical (no mismatch) there is no current flowing over the lines 81, 82. Therefore, the arrangement can still be regarded as comprising two separate ring structures.

The supply terminals 21, 22, 25, and 26 may be connected to voltage supplies or to current supplies—in the latter case the two terminals may be tied together or not.

The lower picture in FIG. 6 shows how the electronic device 100 may be connected during a second clock phase of the spinning current cycle. The spinning current contacts 23, 24, 27, and 28 now function as supply contacts, whereas the spinning current contacts 21, 22, 25, and 26 function as sense contacts.

In accordance with the embodiment shown in FIG. 6, the output voltage(s) or signal(s) is/are not tapped between the two tubs of the same basic electronic device 10-1, 10-2, but between tubs belonging to different basic electronic devices 10-1, 10-2. In particular, the differential output voltages/signals typically are tapped at different common mode potentials. The two additional tubs 13, 14 of the second ring structure fulfill a function of generating differential output voltages.

Figure 7:
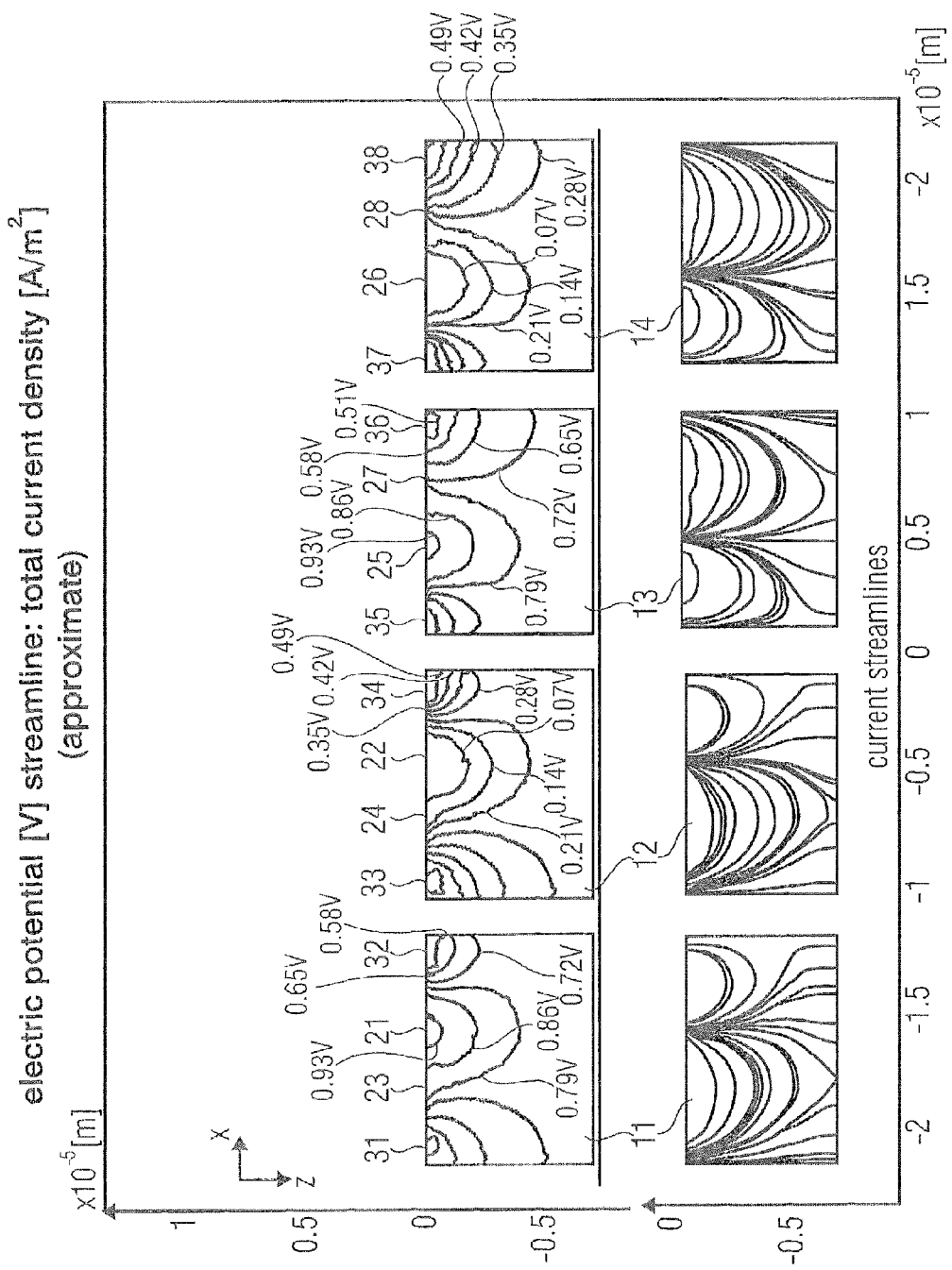
FIG. 7 shows a graph illustrating in a cross-sectional view the electric potential and the current streamlines within the four Hall effect regions of the embodiment shown in FIG. 6.

FIG. 7 shows a graph illustrating in a cross-sectional view the electric potential and the current streamlines within the four Hall effect regions 11 to 14 of the embodiment shown in FIG. 6 with connections as in phase 1 and without shorts 81 and 82. The graph shown in FIG. 7 is based on a simulation result for an electric potential and a current density for such a structure at a magnetic field strength of 0 T. Other parameters that have been chosen for the sake of simulation are: the tub is 6.5 µm deep, 9.7 µm wide (perpendicular to the drawing plane), and 9 µm long. Each contact is 1 µm long, and 9.7 µm wide. The bottom of each tub is highly conductive (e.g. $n^+$ doped buried layer, nBL). Note that the electronic device (e.g., vertical Hall device) according to the teachings disclosed herein works also if the bottom of the tub is isolated.

During the first clock phase of the spinning current cycle, for which a simulation of an electrical potential at a surface of the Hall effect regions and of the current density is shown in FIG. 7, a voltage of 1V is applied both between the supply contacts 21 and 22 of the first ring structure and between the supply contacts 25 and 26 of the second ring structure. At the ring-contacting contacts 31 to 38, a moderate voltage comprised between approximately 0.4V and 0.6V may be observed. The current streamlines indicate that the current distribution is substantially symmetrical for the purposes of an application of the spinning current scheme.

Figure 8:
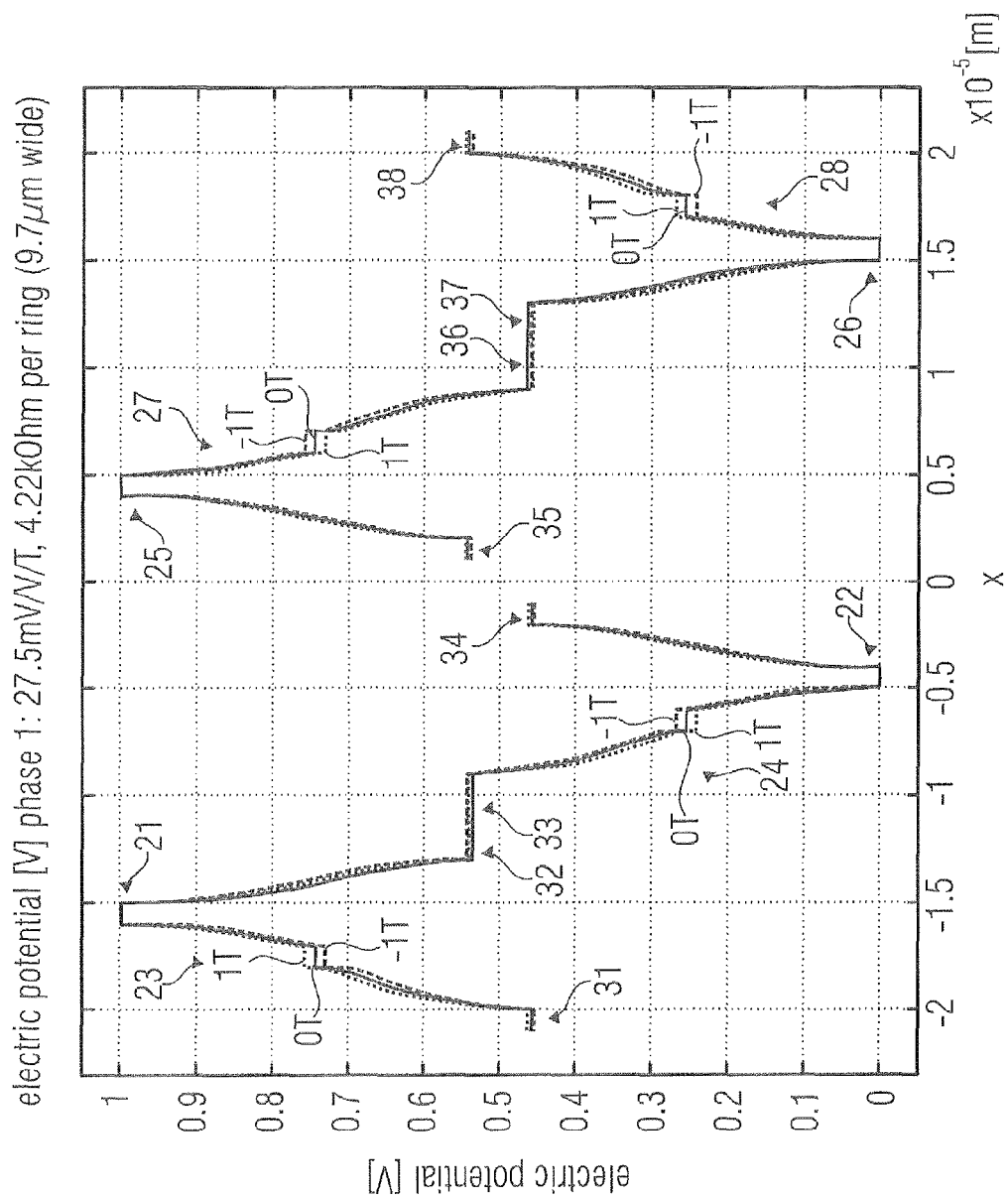
FIG. 8 shows a graph illustrating, for three different magnetic field values, the electric potential at a surface of the four Hall effect regions of the electronic device according to the embodiment shown in FIG. 6 and corresponding to the cross-sectional view the electric potential shown in FIG. 7.

FIG. 8 shows a graph illustrating, for three different magnetic field values, the electric potential at a surface of the four Hall effect regions 11 to 14 of the electronic device according to the embodiment shown in FIG. 7. Note that the potential at the contacts 23 and 28 at the position $x=+/-1.7 \times 10^{-5}$ m $(+/-17$ µm) increases with positive magnetic field whereas the potential at the contacts 24 and 27 at the position $x=+/-0.7 \times 10^{-5}$ m $(+/-7$ µm) decreases with positive magnetic field. Two differential voltages can be tapped: the one at a common mode potential of around 0.75V and the other at the common mode potential of around 0.25V. The magnetic sensitivity is approximately 27.5 mV/V/T. Each ring structure has a resistance of approximately 4.22 kOhm at a width of 9.7 µm.

If we introduce the shorts 81, 82 (=thick broken lines above in FIG. 6) the potentials are pretty similar to what is shown in FIG. 8, yet the magnetic sensitivity decreases slightly to 25.5 mV/V/T, whereas the higher degree of symmetry in the device reduces the residual offset (=offset, which is left after a spinning current sequence due to non-linearity of the device and imperfections of the circuit).

The embodiments shown in the following FIGS. 9 to 23 illustrate various arrangements with respect to the layout of the Hall effect regions 11 to 14, the various arrangements differing with respect to $2^{nd}$ order effects, such as amount of wiring/cabling, required space, thermo-electrical effects, self field, matching, etc.

Figure 9:
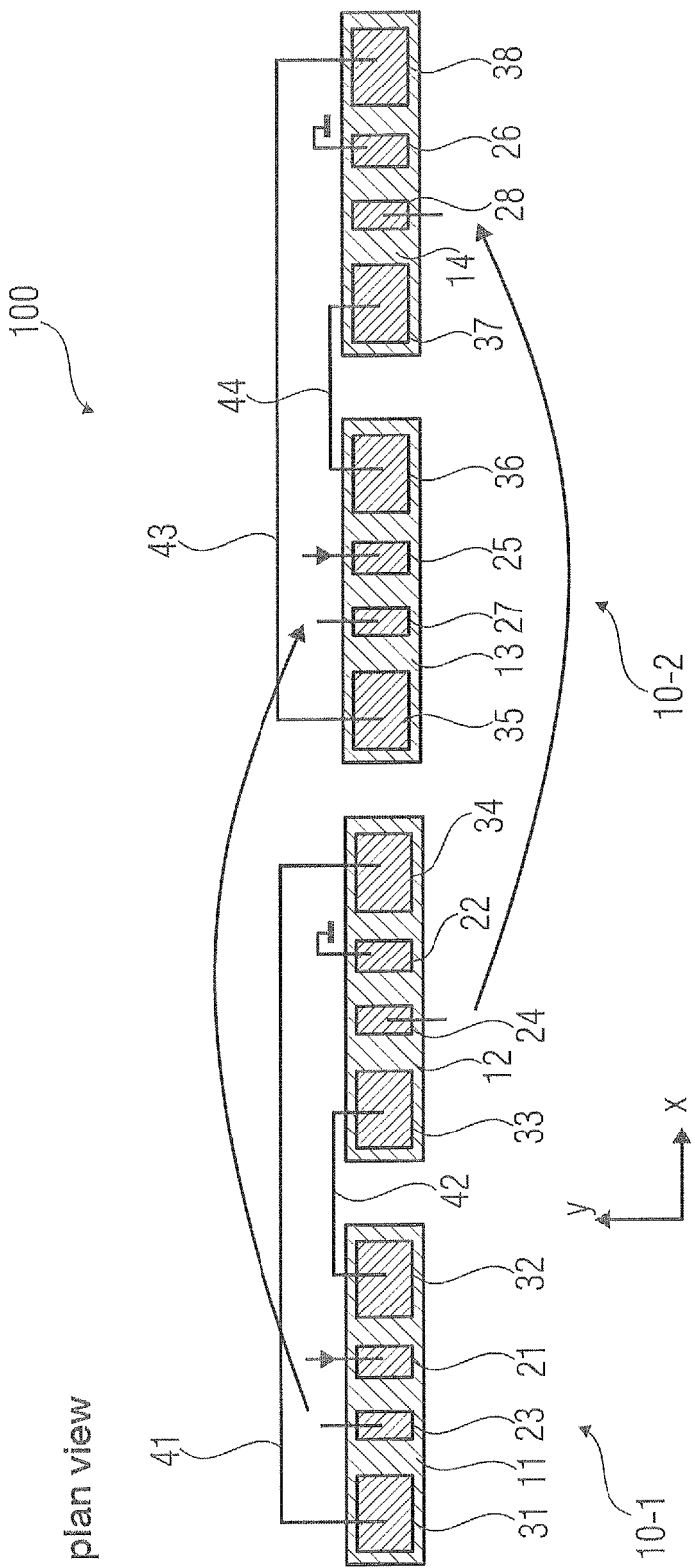
FIG. 9 shows a schematic plan view of an electronic device according to an embodiment with four Hall effect regions arranged in a line.

FIG. 9 shows a schematic plan view of an electronic device 100 according to an embodiment with four Hall effect regions arranged in a line, i.e. a longitudinal configuration. A corresponding cross-section can be readily derived from the schematic plan view of FIG. 9 in an analogous manner as in FIG. 1. FIG. 9 shows the configuration during the first clock phase of the spinning current cycle. The configuration may be described as follows in condensed form: both tubs of each ring are lined up on a single axis and both rings are lined up on the same axis. The first basic electronic device or ring structure 10-1 comprising the Hall effect regions 11 and 12 is substantially identical to the first ring structure of the electronic device shown in FIG. 6. The second basic electronic device or ring structure 10-2 comprising the Hall effect regions 13 and 14 differs from the second ring structure of the electronic device 10 of FIG. 6 in that the supply contacts 25, 26 and the sense contacts 27, 28 have swapped their positions, i.e. in FIG. 9 the supply contacts 25, 26 are the right contacts of the inner contacts of the Hall effect regions 13 and 14. Two differential sense signals, in particular two differential voltages, may be measured. A first differential voltage is measured between i) the sense contact 23 formed at the surface of the first Hall effect region 11 of the first basic electronic device 10-1 and ii) the sense contact 27 formed at the surface of the first Hall effect region 13 of the second basic electronic device 10-2. Hence, the differential voltage is measured in a basic electronic device-spanning manner. A second differential voltage is measured between iii) the sense contact 24 formed at the surface of the second Hall effect region 11 of the first basic electronic device 10-1 and iv) the sense contact 28 formed at the surface of the second Hall effect region 13 of the second basic electronic device 10-2.

Note that the configuration shown in FIG. 9 does not markedly respond to a magnetic field in the y-direction, i.e. the direction in the drawing plane that is perpendicular to the longitudinal axis of the electronic device 10. The reason is that a homogeneous magnetic field in the y-direction causes the electrical potentials to increase or decrease in the same manner at the sense contacts that are used to determine respective differential Hall signals (for example: sense contacts 23 and 27 or sense contacts 24 and 28). However, the structure shown in FIG. 9 is capable of sensing mechanical stress within the semiconductor crystal in which the structure is formed. Indeed, by reversing the polarity of the power supply at one of the rings only, the electronic device may be configured to measure either the magnetic field or the mechanical stress. An electronic device 10, 100 as disclosed herein thus also encompasses a mechanical stress sensor. Features that are claimed and/or described in connection with the electronic device for sensing a magnetic field are typically also applicable to the mechanical stress sensor, provided that the above mentioned condition regarding the polarity of the power supply is fulfilled.

Figure 10:
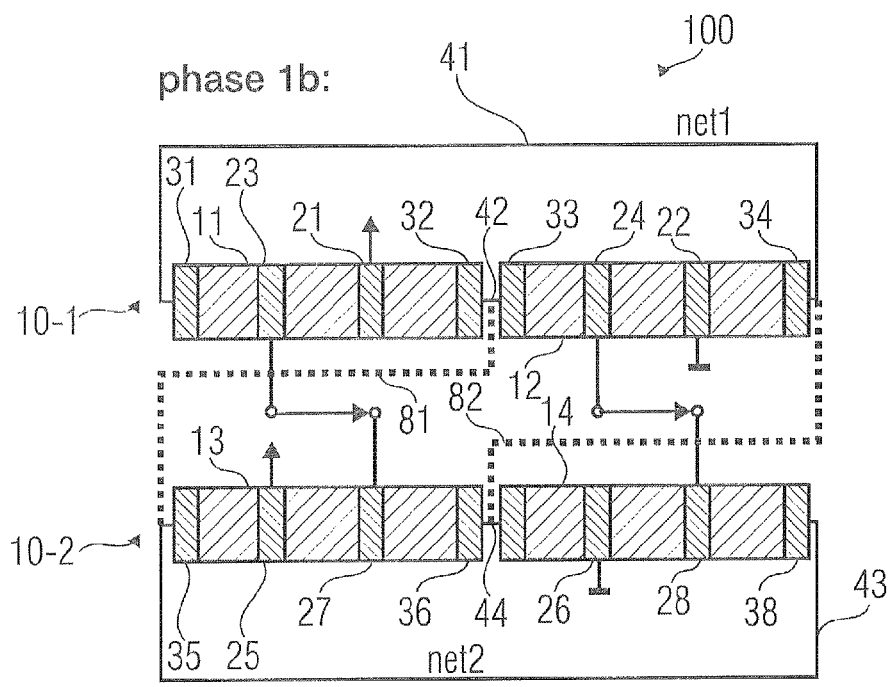
FIG. 10 shows a schematic plan view of an electronic device according to an embodiment with four Hall effect regions arranged in a quadrangle.
Figure 11:
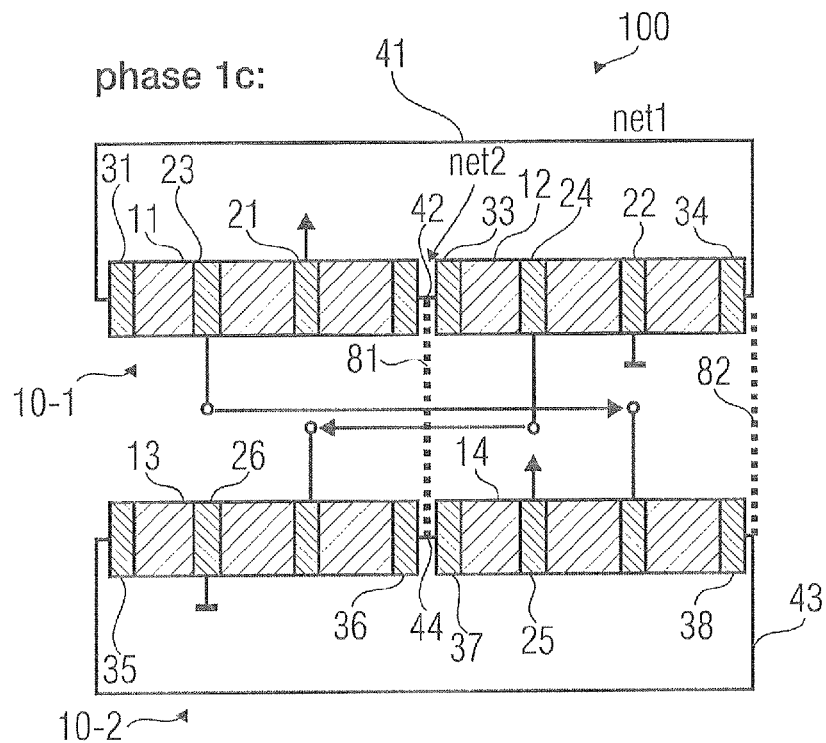
FIG. 11 shows a schematic plan view of an electronic device according to another embodiment with four Hall effect regions arranged in a quadrangle.
Figure 12:
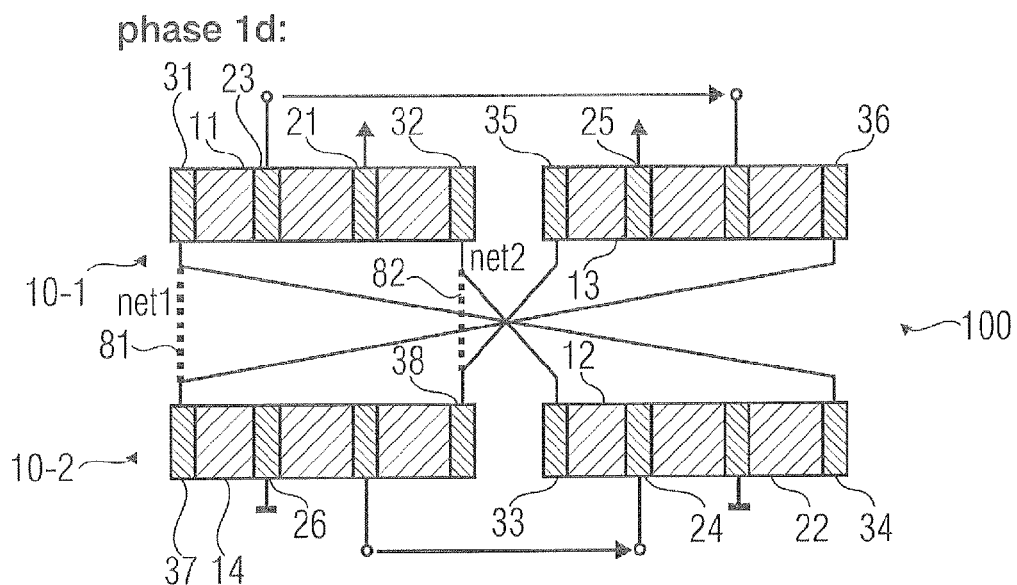
FIG. 12 shows a schematic plan view of an electronic device according to an embodiment with four Hall effect regions arranged in a quadrangle and with diagonal ring structures.

The four tubs 11 to 14 may be arranged in a single line as above, yet they may also be arranged in a 2×2-matrix as shown in FIGS. 10 to 12. The drawings in FIGS. 10 to 12 show the plan views of the various electronic devices 100 in their configurations during operating phase 1; in phase 2 one simply has to exchange supply terminals with sense terminals. All arrangements shown in FIGS. 10 to 12 are substantially equivalent with respect to the Hall signal, yet they are different with respect to thermo-electric and piezo-electric disturbances. These arrangements shown in FIGS. 10 to 12 are generated by mere translation of the tubs—no rotation or mirror symmetric placement has been performed.

FIG. 10 shows a schematic plan view of an electronic device 100 according to an embodiment with four Hall effect regions arranged in a quadrangle. A corresponding cross-section can be readily derived from the schematic plan view of FIG. 10 in an analogous manner as in FIG. 1. The configuration shown in FIG. 10 may be regarded as a lateral configuration. The first basic electronic device or ring structure 10-1 comprises two tubs 11, 12 that are arranged on a line. The second basic electronic device or ring structure 10-2 comprises two further tubs 13, 14 that are arranged on a further line parallel to the line of the first ring structure. The tubs 11 and 13 are substantially aligned to each other in a direction perpendicular to the above mentioned line and the further line. Likewise, the tubs 12 and 14 are substantially aligned to each other in the direction perpendicular to the line and the further line. A first differential voltage is tapped between the aligned tubs 11 and 13, in particular the sense contact 23 of the first basic electronic device 10-1 and a sense contact 27 of the second basic electronic device 10-2. A second differential voltage is tapped between the aligned tubs 12 and 14, in particular between the sense contact 24 of the first basic electronic device 10-1 and the sense contact 28 of the second basic electronic device 10-2. The differential voltages are measured in a basic electronic device-spanning manner in one embodiment.

FIG. 11 shows a schematic plan view of an electronic device 100 according to another embodiment with four Hall effect regions arranged in a quadrangle. A corresponding cross-section can be readily derived from the schematic plan view of FIG. 11 in an analogous manner as in FIG. 1. The configuration shown in FIG. 11 may be regarded as a lateral configuration. The embodiment shown in FIG. 11 is similar to the embodiment shown in FIG. 10 with the following differences: In the second basic electronic device 10-2, the polarity of the supply contacts is inversed and the differential voltages are tapped diagonally between the first tub 11 of the first basic electronic device 10-1 and the second tub 14 of the second basic electronic device 10-2, as well as between the second tub 12 of the first basic electronic device 10-1 and the first tub 13 of the second basic electronic device 10-2. The differential voltages are measured in a basic electronic device-spanning manner.

FIG. 12 shows a schematic plan view of an electronic device 100 according to an embodiment with four Hall effect regions 11 to 14 arranged in a quadrangle and with diagonal ring structures. A corresponding cross-section can be readily derived from the schematic plan view of FIG. 12 in an analogous manner as in FIG. 1. The configuration shown in FIG. 12 may be regarded as a diagonally offset configuration. The first basic electronic device 10-1 forms a diagonal ring structure and comprises the upper left tub 11 and the lower right tub 12. The second basic electronic device 10-2 forms another ring structure and comprises the upper right tub 13 and the lower left tub 14. The differential voltages are measured in a basic electronic device-spanning manner. The second Hall effect region 12 is longitudinally and laterally offset with respect to the first Hall effect region 11. Regarding the second basic electronic device 10-2, the Hall effect region 14 is longitudinally and laterally offset with respect to the Hall effect region 13.

Optionally, the embodiments shown in FIGS. 10 to 12 may comprise shorting circuits (or "shorts" or bridging circuits) 81 and 82.

According to the basic electronic device 10 having only a single ring structure, the first and second Hall effect regions 11, 12 of the single ring structure may be disposed side by side, or laterally offset. Accordingly, the first end of the first Hall effect region and the second end of the second Hall effect region may be adjacent, and vice versa. Typically, the first and second Hall effect regions 11, 12 are elongate and have a longitudinal axis. In a side by side arrangement of the first and second Hall effect regions 11, 12, the second Hall effect region 12 is substantially translated with respect to the first Hall effect region 11 in a direction perpendicular to the longitudinal axis of the first Hall effect region 11 and parallel to the surface thereof.

Figure 13:
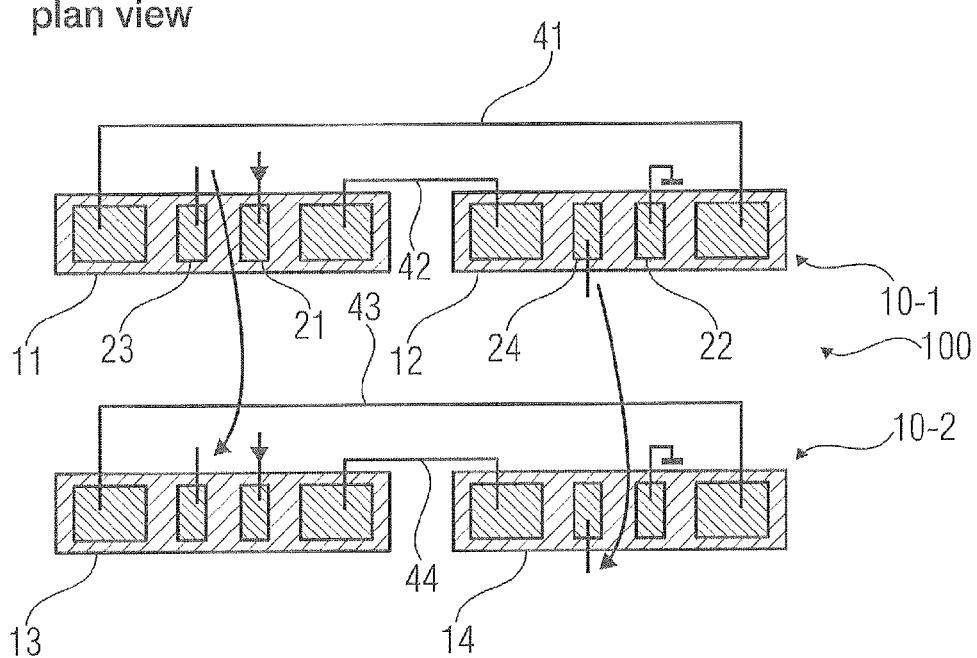
FIG. 13 shows a schematic plan view of an electronic device according to a further embodiment with four Hall effect regions arranged in a quadrangle.

FIG. 13 shows a schematic plan view of an electronic device 100 according to a further embodiment responsive to mechanical stress within the semiconductor crystal in which the Hall effect regions are formed. A corresponding cross-section can be readily derived from the schematic plan view of FIG. 13 in an analogous manner as in FIG. 1. The electronic device, or mechanical stress sensor, comprises two basic electronic devices 10-1, 10-2 having collectively four Hall effect regions 11 to 14 arranged in a quadrangle. This embodiment has some features in common with the embodiment shown in FIG. 10. Deviating from FIG. 10, the two ring structures are substantially identical in the embodiment of FIG. 13. Two differential voltages are tapped between the first and the second ring structures between sense contacts at substantially the same locations within the ring structure: the left one of the inner contacts of each tub 11 to 14. Note that a magnetic field may influence the electric potentials at the sense contacts 23, 24 due to the Hall effect. However, the electric potentials at these sense contacts 23, 24 are influenced substantially in the same manner so that the Hall effect-related portions of the electric potentials substantially cancel each other out when a differential signal is determined on the basis of the two electric potentials at the sense contacts 23, 24. The magnetic field does not, or only negligibly, influence said differential signal. Instead, the differential signal is mostly a function of the mechanical stress within the semiconductor crystal. In this manner, the influence of the Hall effect and of a magnetic field in the output signal of a mechanical stress sensor may be reduced. For this reason, the Hall effect regions 11 to 14 that are responsive to a vertical Hall effect have the effect of substantially cancelling out an influence of a magnetic field on the output signal of the mechanical stress sensor.

It is also possible to arrange the four tubs 11 to 14 in a single column and there are also several combinations of sequential order (from top to bottom), as will be illustrated in more detail below (FIGS. 22 and 23).

Figure 14:
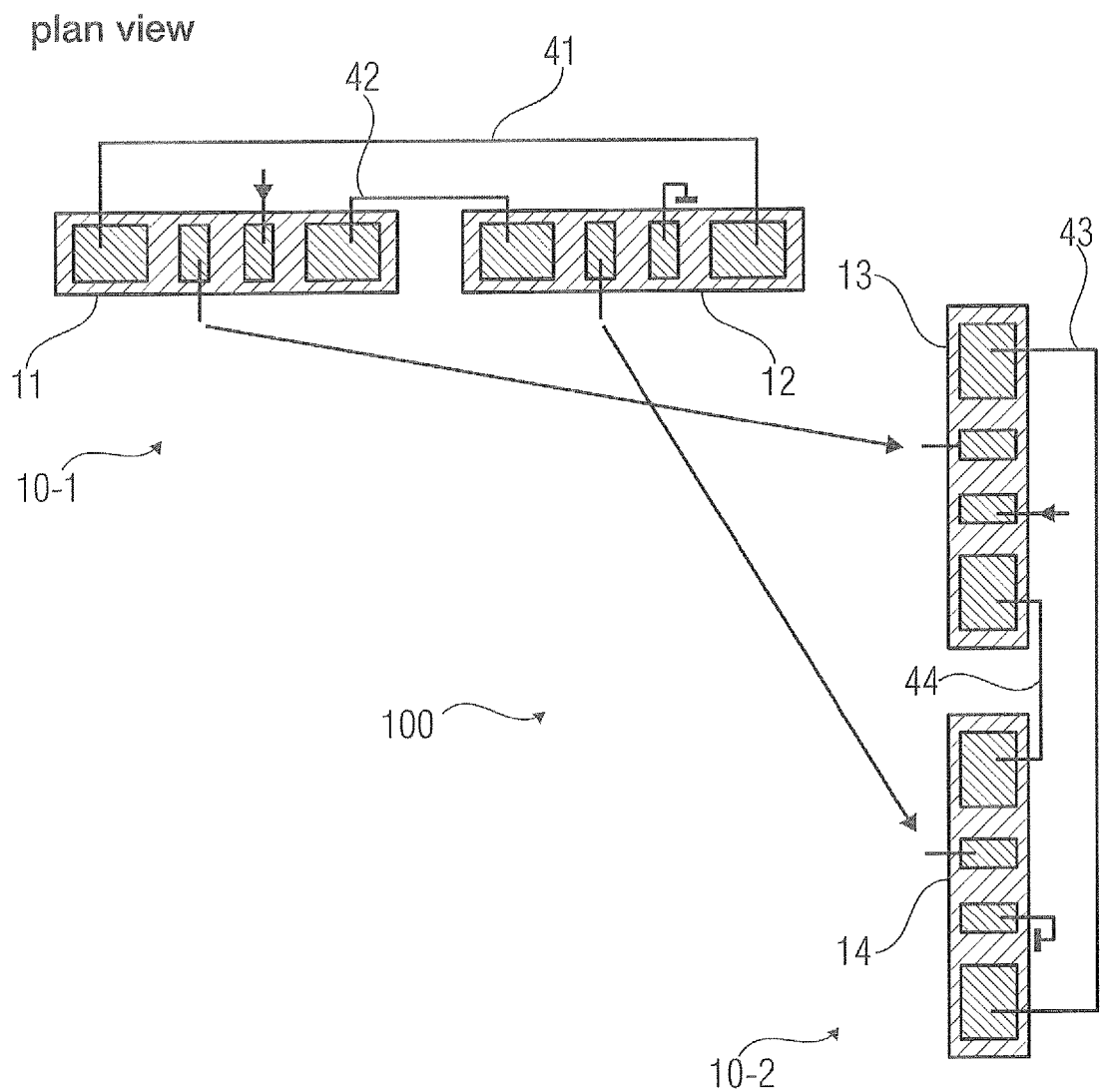
FIG. 14 shows a schematic plan view of an electronic device according to an embodiment with four Hall effect regions, two of which are connected in a first ring and are arranged at an angle of 90 degrees to the other two Hall effect regions that are connected in a second ring.

FIG. 14 shows a schematic plan view of an electronic device 10 according to an embodiment with four Hall effect regions 11 to 14. A corresponding cross-section can be readily derived from the schematic plan view of FIG. 14 in an analogous manner as in FIG. 1. The configuration shown in FIG. 14 may be regarded as an angled configuration and is responsive to mechanical stress. The two Hall effect regions 11 and 12 are arranged on the same line and belong to a first basic electronic device 10-1 forming a ring structure. The two Hall effect regions 13 and 14 are arranged on another, non-parallel line and belong to a second basic electronic device 10-2 forming a ring structure. In particular, the Hall effect regions 13, 14 of the second basic electronic 10-2 device are arranged at an angle of 90 degrees (other angles are possible) with respect to the Hall effect regions 11, 12 of the first basic electronic device 10-1. Two differential voltages are measured in a basic electronic device-spanning manner. Typically, the output signals are linear combinations of both magnetic field components parallel to the surface of the die. The coefficients of these linear combinations depend on the angles between the lines along which both rings are arranged.

Figure 15:
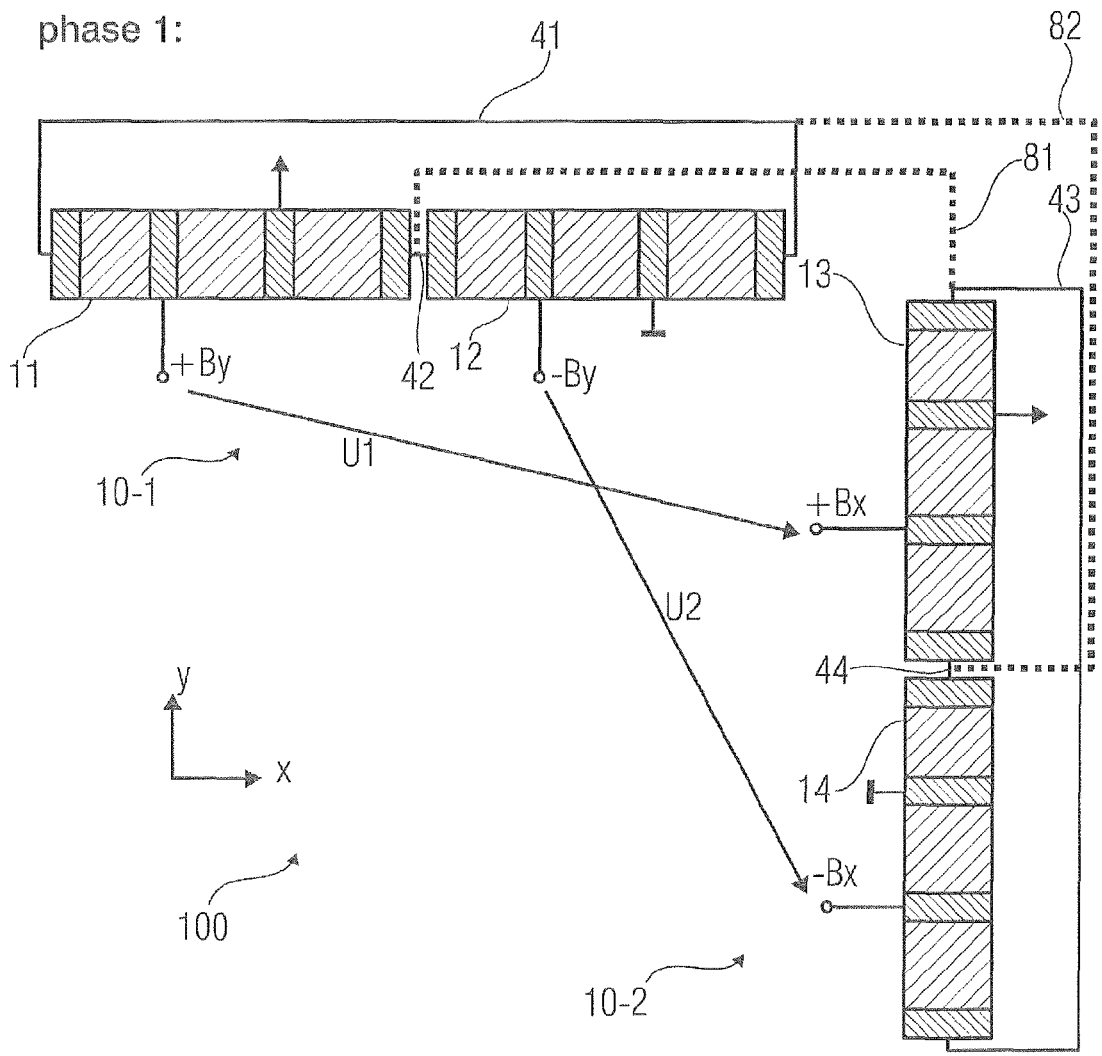
FIG. 15 shows a schematic plan view of an electronic device according to an embodiment with four Hall effect regions similar to the embodiment shown in FIG. 14.

FIG. 15 shows a schematic plan view (top view) of an electronic device 100 according to an embodiment with four Hall effect regions 11 to 14 similar to the embodiment shown in FIG. 14, i.e. an angled configuration. However, the spinning current contacts of the second basic electronic device 10-2 in FIG. 15 have different functions during the first clock phase than in FIG. 14. In particular, the supply contacts in the second basic electronic device 10-2 are, during the first operating phase of the spinning current scheme, the second contacts from the top in the respective Hall effect region 13, 14. A first differential voltage U1 is measured between a sense contact of the first tub 11 of the first basic electronic device 10-1 and a sense contact of the first tub 13 of the second basic electronic device 10-2. A second differential voltage U2 is measured between a sense contact of the second tub 12 of the first basic electronic device 10-1 and a sense contact of the second tub 14 of the second basic electronic device 10-2. The first differential voltage U1 is proportional to −Bx+By, i.e. a first linear combination of the magnetic field components in the x-direction and in the y-direction. The second differential voltage U2 is proportional to Bx−By, i.e. a second linear combination of the magnetic field components in the x-direction and in the y-direction. Note that U2 is substantially equal to the inverse of U1, i.e., U2=−U1 (when inaccuracies are neglected). A corresponding cross-section can be readily derived from the schematic plan view of FIG. 15 in an analogous manner as in FIG. 1.

Figure 16:
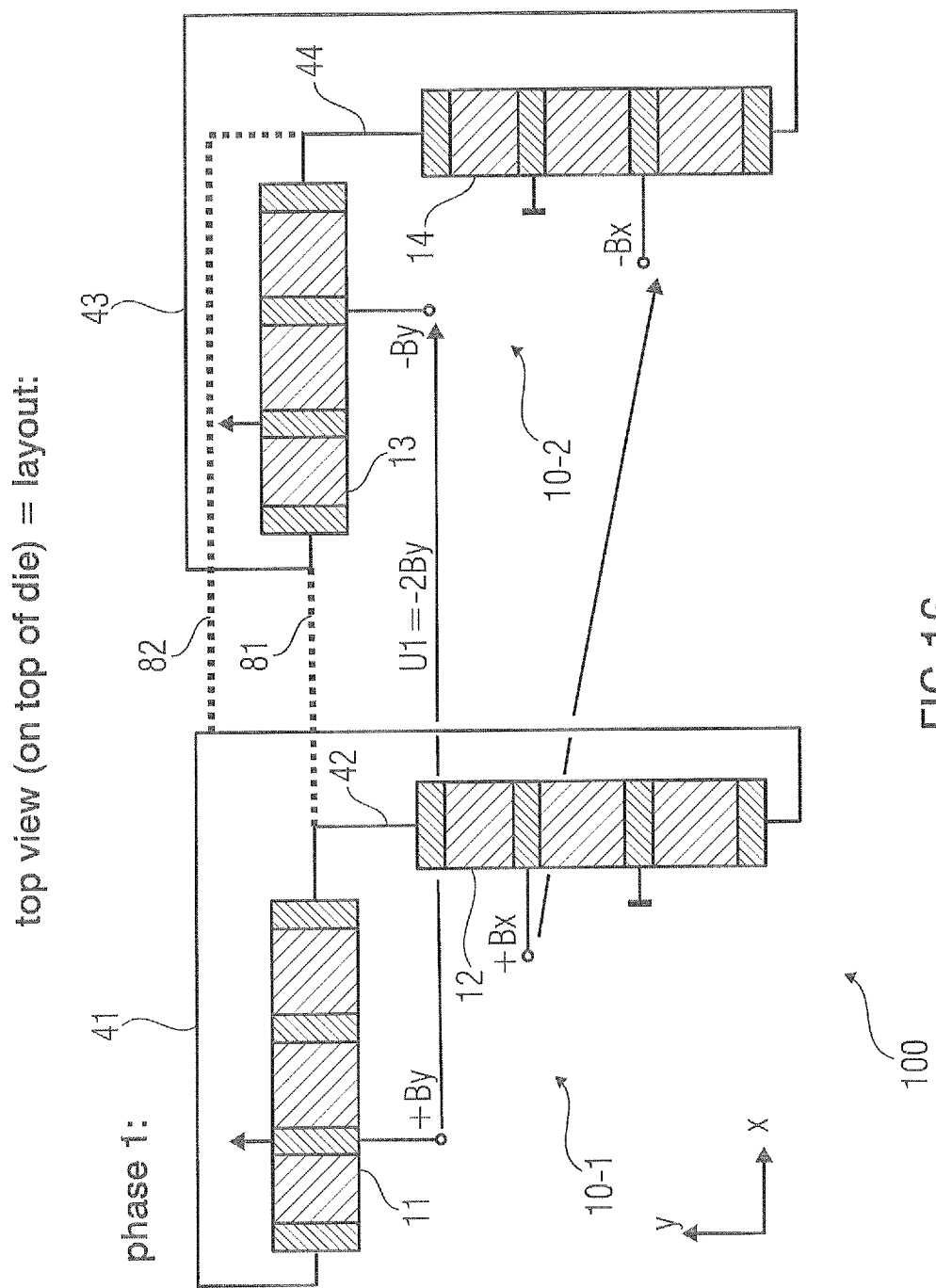
FIG. 16 shows a schematic plan view of an electronic device according to an embodiment, wherein each ring structure comprises two Hall effect regions disposed at an angle of 90 degrees to each other.

FIG. 16 shows a schematic top view of an electronic device 100 according to an embodiment, wherein each basic electronic device 10-1, 10-2 comprises two Hall effect regions disposed at an angle of 90 degrees (other angles are possible) to each other. Hence, this embodiment uses an arrangement, where the two tubs of each ring or basic electronic device 10-1, 10-2 are rotated with respect to each other by e.g. 90 degrees in the layout. Two differential voltages U1 and U2 may be measured. In the case depicted in FIG. 16, the first differential voltage U1 is measured between the tub 11 belonging to the first basic electronic device 10-1 and the tub 13 belonging to the second electronic device 10. The second differential voltage U2 is measured between the tub 12 belonging to the first basic electronic device 10-1 and the tub 14 belonging to the second basic electronic device 10-2. The first differential voltage U1 is proportional to the term −2By. The second differential voltage is proportional to the term 2Bx. A corresponding cross-section can be readily derived from the schematic plan view of FIG. 16 in an analogous manner as in FIG. 1.

The second ring may also be rotated as a whole with respect to the first one by some angle: then U2 is not proportional to 2Bx but some linear combination of the magnetic field components Bx and By, depending on the exact angular position of the second ring (basic electronic device 10-2) with respect to the first ring (basic electronic device 10-1). Having several arrangements like this at different angular positions the system can reconstruct Bx and By by proper linear combinations of the signals delivered by these systems. For all these arrangements it is possible to shift the position of each tub as a pure translation, in order to arrange them in columns or lines or even in an interdigital arrangement. This may improve matching and errors due to thermo-electric voltages.

Note that the output signals may be in voltage domain (as given in FIGS. 15 and 16, such as U1, U2, . . . )—however, one may also short the sense pins and measure the short circuit currents I1, I2, . . . which carries the same information as the voltage, according to U1=Ri1*I1, U2=Ri2*I2, . . . with Ri1, Ri2 denoting the internal resistances of the devices in the respective electrical configurations. If the current-voltage characteristics of the devices (at zero magnetic field) are linear, U1 and I1 correspond to each other and give the same residual offset over a full spinning current cycle. Yet, if the current-voltage characteristics of the devices are nonlinear, the residual offset of the signals in current domain should typically be more accurate than in voltage domain, because the nonlinear current-voltage characteristics reduce the effect of nonlinearity.

Figure 17:
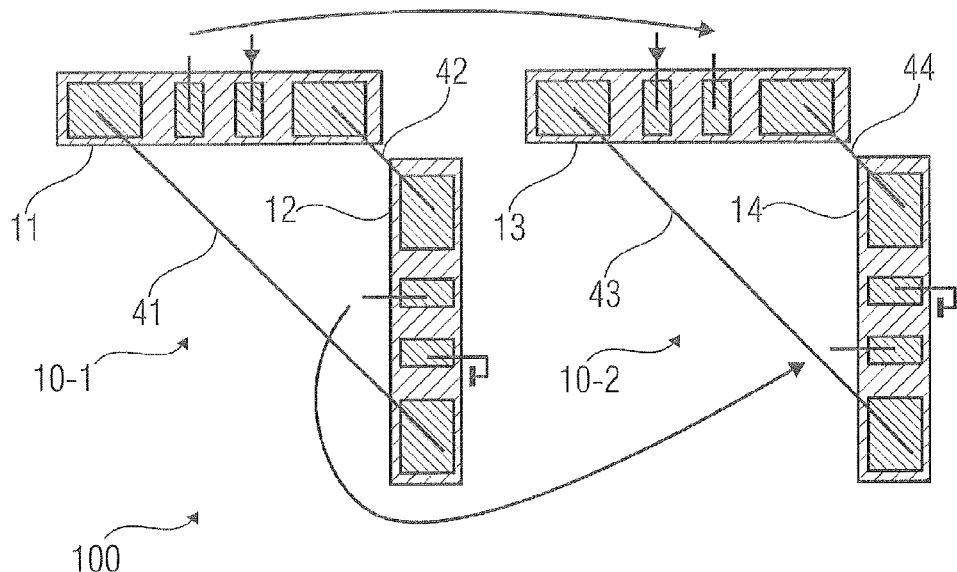
FIG. 17 shows a schematic plan view of an electronic device according to an embodiment similar to the embodiment shown in FIG. 16.

FIG. 17 shows a schematic plan view of an electronic device 100 according to an embodiment similar to the embodiment shown in FIG. 16. A difference between the embodiments shown in FIGS. 16 and 17 is that the first and second contacts of the tubs 11 to 14 are larger than the supply/sense contacts 21 to 28. In both embodiments according to FIGS. 16 and 17, the tubs belonging to the same basic electronic device 10-1, 10-2 are arranged on different axes that form an angle of e.g. 90 degrees. A corresponding cross-section can be readily derived from the schematic plan view of FIG. 17 in an analogous manner as in FIG. 1.

Figure 18:
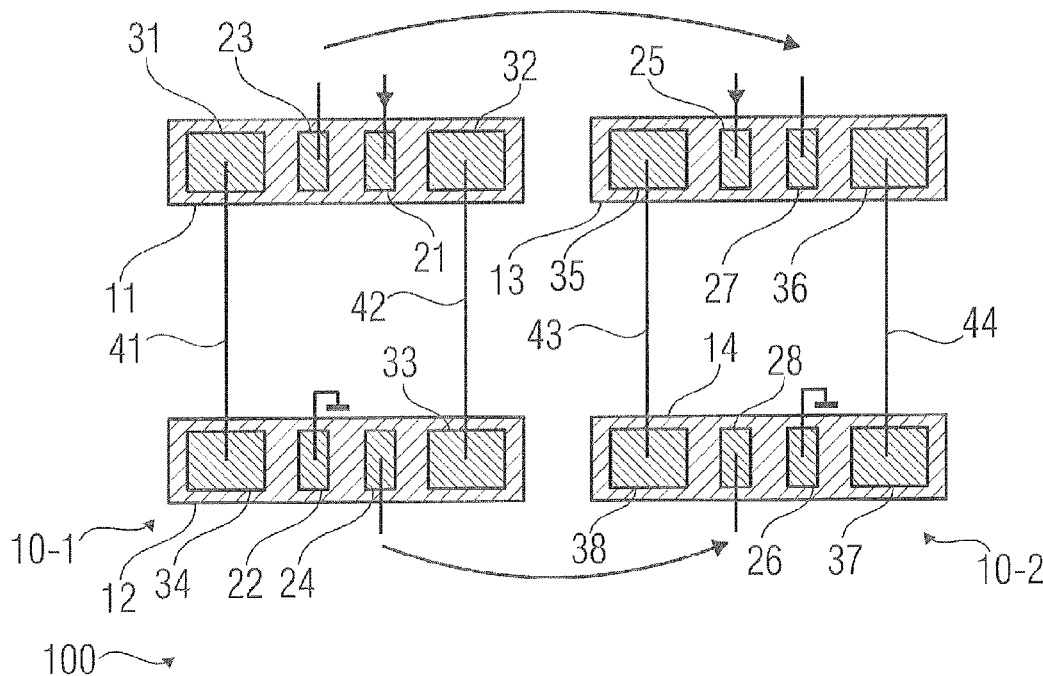
FIG. 18 shows a schematic plan view of an electronic device according to an embodiment comprising four Hall effect regions arranged in a quadrangle.

FIG. 18 shows a schematic plan view of an electronic device 10 according to an embodiment comprising four Hall effect regions 11 to 14 arranged in a quadrangle. A corresponding cross-section can be readily derived from the schematic plan view of FIG. 18 in an analogous manner as in FIG. 1. Regarding the arrangement of the first and second basic electronic devices 10-1, 10-2, the embodiment shown in FIG. 18 has a longitudinal configuration because the right basic electronic device 10-2 is provided in an extension of the longitudinal axis of the left (first) basic electronic device 10-2. A first basic electronic device 10-1 comprises the tubs 11 and 12 that are laterally displaced with respect to each other. A second basic electronic device 10-2 comprises the tubs 13 and 14 that are also laterally displaced with respect to each other. The two basic electronic devices 10-1, 10-2 are arranged on a line extending along a longitudinal direction of the four tubs 11 to 14, i.e. the two ring structures are aligned in the longitudinal direction of the four tubs 11 to 14. The embodiment of FIG. 18 may be briefly described as follows: both tubs of each basic electronic device (or ring) 10-1, 10-2 are parallel to each other but on different lines and both rings are next to each other. A more elaborate description of the embodiment shown in FIG. 18 reveals that the electronic device comprises a first Hall effect region 11, a second Hall effect region 12, a third Hall effect region 13, and a fourth Hall effect region 14 that are isolated from each other. Each Hall effect region 11 to 14 comprises a first contact, a second contact, a supply contact, and a sense contact in or on surfaces of the respective Hall effect region 11 to 14. The first contact 33 of the second Hall effect region 12 is connected to the second contact 32 of the first Hall effect region 11 and the first contact 31 of the first Hall effect region 11 is connected to the second contact 34 of the second Hall effect region 12, so that two current paths exist between the supply contact 21 of the first Hall effect region 11 and the supply contact 22 of the second Hall effect region 12. In a similar manner the first contact 37 of the fourth Hall effect region 14 is connected to the second contact 36 of the third Hall effect region 13 and the first contact 35 of the third Hall effect region 13 is connected to the second contact 38 of the fourth Hall effect region, so that two current paths exist between the supply contact 25 of the third Hall effect region 13 and the supply contact 26 of the fourth Hall effect region 14. The supply contacts 21, 22, 25, 26 and the sense contacts 23, 24, 27, 28 (in the first operating phase) are arranged in a sequence along each one of the current paths such that there is one sense contact of the sense contacts between two of the supply contacts. A first differential sense signal is tapped between the sense contacts 23 and 27 of the first and third Hall effect regions 11 and 13, respectively, and a second differential sense signal is tapped between the sense contacts 24 and 28 of the second and fourth Hall effect regions 12 and 14, respectively.

Figure 19:
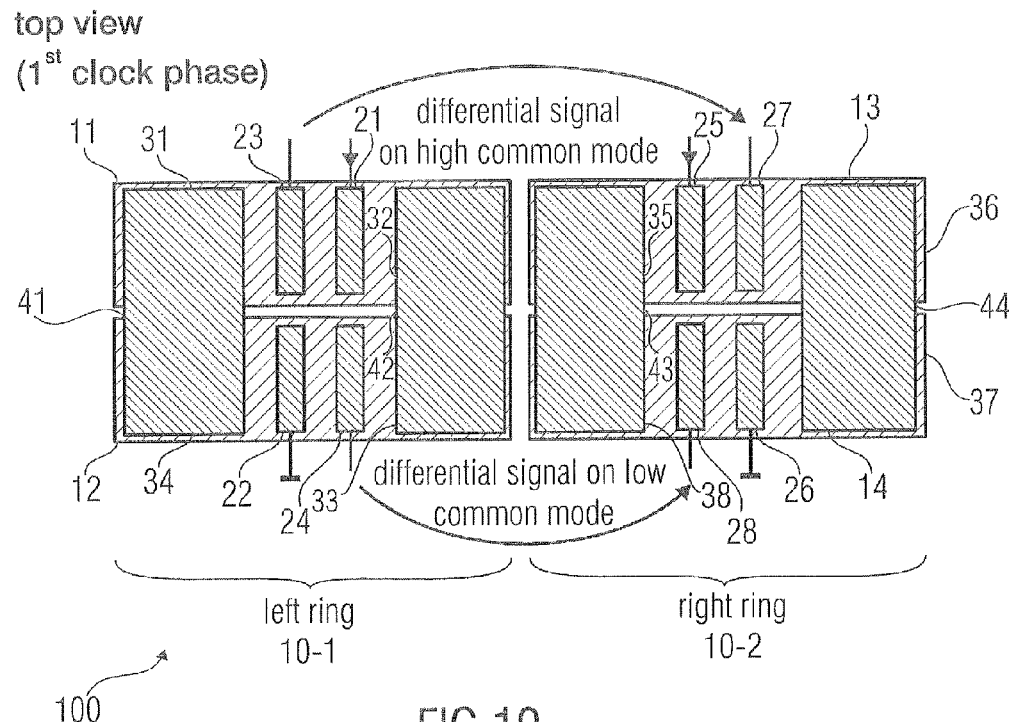
FIG. 19 shows a schematic plan view of an electronic device according to an embodiment similar to the one shown in FIG. 18.
Figure 21:
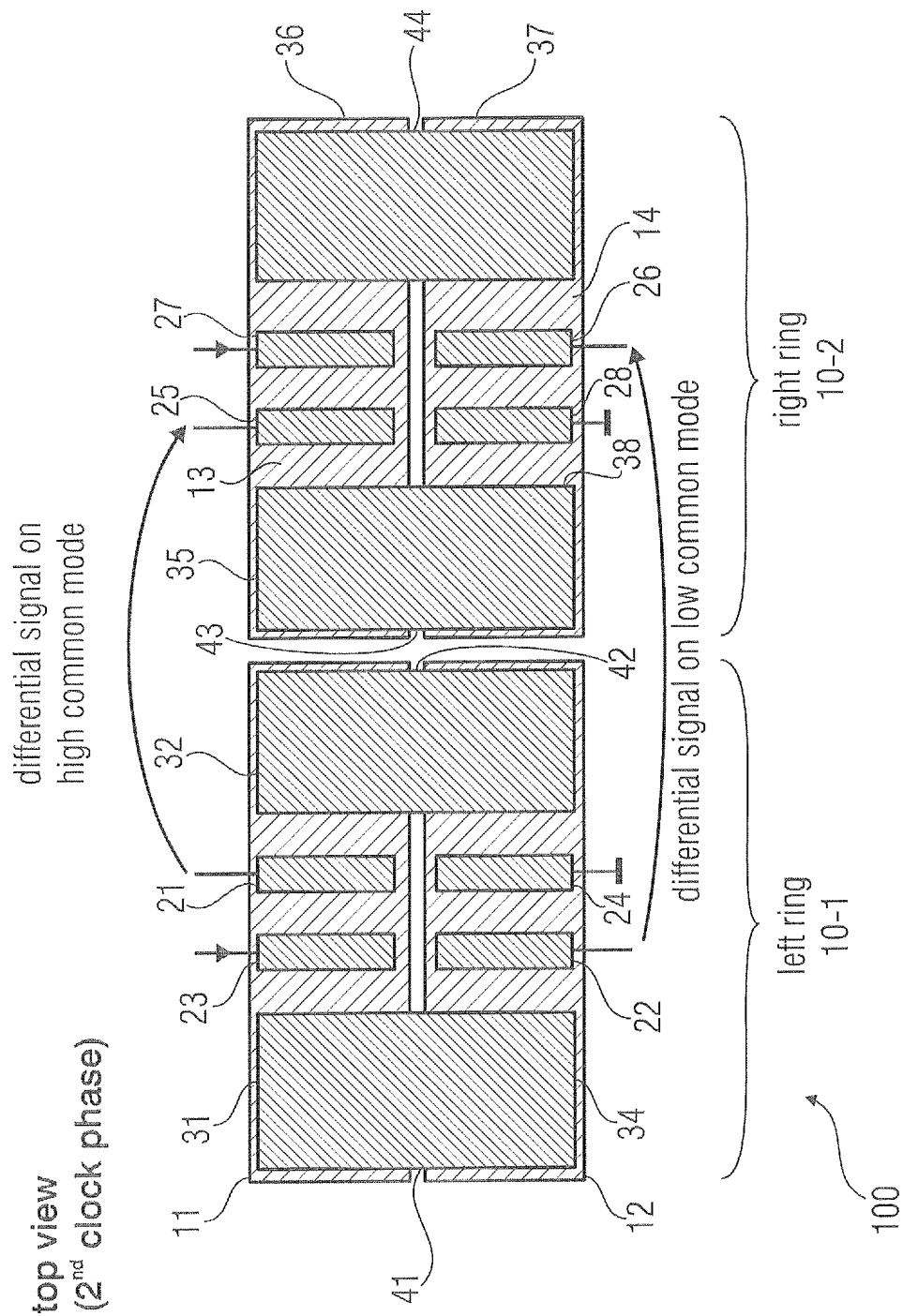
FIG. 21 shows a schematic plan view of an electronic device according to an embodiment similar to the one shown in FIG. 19.

FIG. 19 shows a schematic top view of an electronic device 100 according to an embodiment similar to the one shown in FIG. 18. Again, the configuration of the electronic device 100 during the first clock phase is shown. The configuration during the second clock phase is shown in FIG. 21 and can be deduced by swapping the supply contacts and the sense contacts. Both wells or tubs 11, 12 of the first basic electronic device 10-1 (left ring) are arranged in a two-dimensional way. In the same manner, the wells or tubs 13, 14 of the second basic electronic device (right ring) 10-2 are arranged in a two-dimensional way. The potential distribution in the second basic electronic device 10-2 is substantially a mirrored version of the potential distribution in the first basic electronic device 10-2 with respect to a mirror axis (or symmetry axis) located to the right of the first basic electronic device 10-1, i.e. substantially adjacent and parallel to the second connection 42. The connections 41 to 44 do not, in the embodiment shown in FIG. 19, comprise wires or strip lines, but are provided by extensions or prolongations of the ring-contacting contacts 31 to 38 so as to bridge a gap between the first and second Hall effect regions 11 and 12 of the first basic electronic device 10-1 and, mutatis mutandis, between the first and second Hall effect regions 13 and 14 of the second basic electronic device 10-2. A corresponding cross-section can be readily derived from the schematic plan view of FIG. 19 in an analogous manner as in FIG. 1.

A differential signal on high common mode is tapped between the sense contacts 23 and 27. The sense contact 23 is part of the first basic electronic device 10-1 and the sense contact 27 is part of the second basic electronic device 10-2. Moreover, a differential signal on low common mode is tapped between the sense contacts 24 (part of the first basic electronic device 10-1) and 28 (part of the second basic electronic device 10-2).

Figure 20:
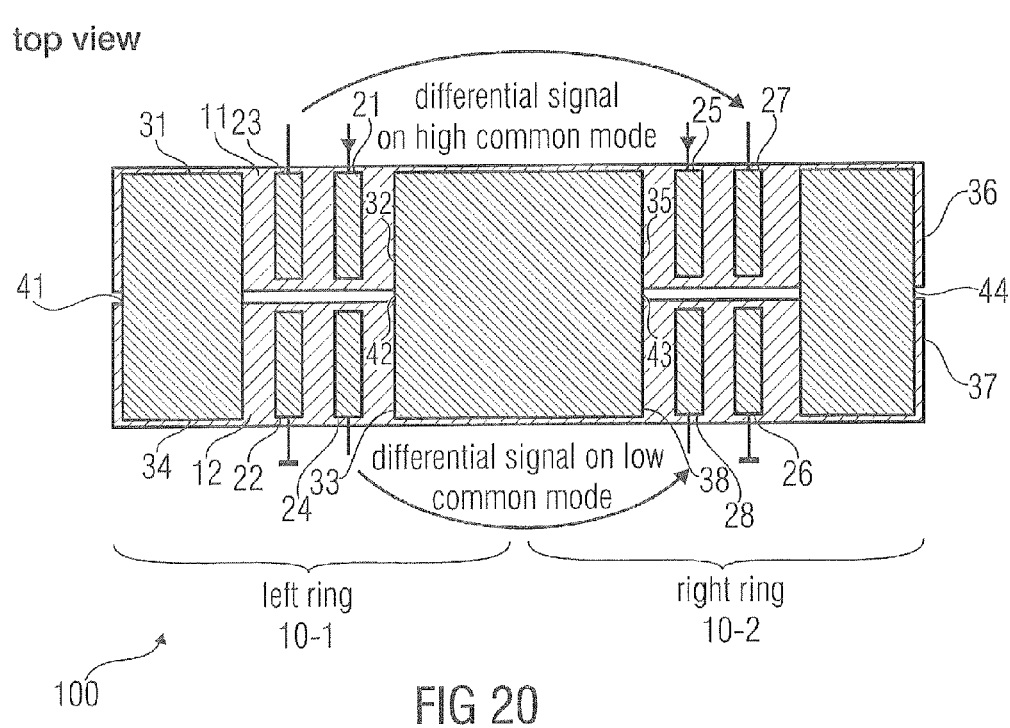
FIG. 20 shows a schematic plan view of an electronic device according to an embodiment combining the embodiments shown in FIG. 2 and FIG. 19.

FIG. 20 shows a schematic top view of an electronic device according to an embodiment combining the embodiments shown in FIG. 2 and FIG. 19. A corresponding cross-section can be readily derived from the schematic plan view of FIG. 20 in an analogous manner as in FIG. 1. Starting out at the embodiment shown in FIG. 19, the left and right tubs may be combined to save space. This leads to two long tubs 11, 12. The first basic electronic device 10-1 (left ring) and the second basic electronic device 10-2 (right ring) are shorted at the ring-contacting contacts 32, 33, 35, and 38 via the connections 42 and 43 which are formed as one piece in the embodiment shown in FIG. 20. In this last case the two outer ring-contacting contacts 31 and 36 may or may not be shorted. Also the two spinning current contacts or terminals 21 and 25 where current is injected in a specific clock phase may be shorted (analogously, spinning current contacts 22 and 26 may be shorted during the second clock phase).

The embodiment shown in FIG. 20 may also be described as follows: The first Hall effect region 11 and the third Hall effect region 13 merge at one of their first ends and second ends, respectively. Also the second Hall effect region 12 and the fourth Hall effect region 14 merge at one of their first ends and second ends, respectively.

FIG. 21 shows a schematic top view of the electronic device 100 according to the embodiment shown in FIG. 19 during a second clock phase. A corresponding cross-section can be readily derived from the schematic plan view of FIG. 21 in an analogous manner as in FIG. 1. The current is supplied in the following way: the current enters at the spinning current contacts 23 and 27 (now functioning as supply contacts). The spinning current contacts 24 and 28, that also function as supply contacts during the second clock phase, are connected to a ground potential. A first differential signal is tapped between the spinning current contacts 21 and 25, now functioning as sense contacts. The first differential contacts 21 and 25 are both on a high common mode. A second differential signal is tapped between the spinning current contacts 22 and 26, now functioning as sense contacts. The second differential contacts 22 and 26 are both on a low common mode.

FIG. 22 shows a schematic plan view of an electronic device 100 according to an embodiment comprising four Hall effect regions arranged in a column. A corresponding cross-section can be readily derived from the schematic plan view of FIG. 22 in an analogous manner as in FIG. 1. A first basic electronic device 10-1 comprises the Hall effect regions 11 and 12. A second basic electronic device 10-2 comprises the Hall effect regions 13 and 14. The second basic electronic device 10-2 is arranged laterally displaced with respect to the first basic electronic device 10-1. Two differential signals are tapped in a basic electronic device-spanning manner. The first differential signal is measured between the sense contact 23 at the first tub 11 of the first basic electronic device 10-1 (upper ring in FIG. 22) and the sense contact 27 at the first tub 13 of the second basic electronic device 10-2 (lower ring in FIG. 22). The second differential signal is measured between the sense contact 24 at the second tub 12 of the first basic electronic device 10-1 (upper ring) and the sense contact 28 of the second tub of the second basic electronic device 10-2 (lower ring).

FIG. 23 shows a schematic plan view of an electronic device 100 according to another embodiment comprising four Hall effect regions arranged in a column wherein the basic electronic device 10-1, 10-2 are interleaved or concentric with respect to each other, i.e. a concentric configuration. A corresponding cross-section can be readily derived from the schematic plan view of FIG. 23 in an analogous manner as in FIG. 1. A first basic electronic device 10-1 comprises the tubs 11 and 12 and a second basic electronic device 10-2 comprises the tubs 13 and 14. The first basic electronic device 10-1 is an outer ring which surrounds the second basic electronic device 10-2, which consequently forms an inner ring. A first differential signal is measured between a sense contact 23 at the first tub 11 of the first basic electronic device 10-1 (outer ring in FIG. 23) and the sense contact 27 at the first tub 13 of the second basic electronic device 10-2 (inner ring in FIG. 23). The second differential signal is measured between the sense contact 24 at the second tub 12 of the first basic electronic device 10-1 (outer ring) and the sense contact 28 of the second tub of the second basic electronic device 10-2 (inner ring).

FIG. 24 shows two schematic top views of an electronic device 100 according to an embodiment of the teachings disclosed herein during a first phase and a second phase of a measuring cycle, the electronic device comprising four Hall effect regions, each having a single spinning current contact. Corresponding cross-sections can be readily derived from the schematic plan views of FIG. 24 in an analogous manner as in FIG. 1. The embodiment uses four isolated tubs 11 to 14, each having three contacts: two outer contacts per tub and one inner contact per tub. The inner contact is used as a sense-terminal or a supply-terminal in consecutive phases of the spinning current Hall probe sequence. The four tubs are wired together with their outer contacts to form a ring. The first tub 11 comprises the two ring-contacting contacts 31 and 32 as the outer contacts and the spinning current contact 23 as the inner contact. The second tub 12 comprises the two ring-contacting contacts 33 and 34 as the outer contacts and the spinning current contact 21 as the inner contact. The third tub 13 comprises the two ring-contacting contacts 35 and 36 as the outer contacts and the spinning current contact 24 as the inner contact. The fourth tub 14 comprises the two ring-contacting contacts 37 and 38 as the outer contacts and the spinning current contact 22 as the inner contact. One differential signal is measured during the first clock phase between the sense contacts 23 and 24.

In the second clock phase, the ring-contacting contacts 31 to 38 are not changed compared to the first clock phase. However, the spinning current contacts 21 to 24 change their respective functions from supply contact to sense contact, and vice versa. Hence, an electric current is now fed to the first tub 11 at spinning current contact 23 to flow through the four tubs 11, 12, 13, 14 and the connections 41, 42 to the supply contact 24 where the current exits the tub 13. As explained above, the current is distributed in a substantially uniform manner to follow a first conducting path in a clockwise direction via connection 41 and to follow another conducting path in a counter clockwise direction via the connection 42. The arrangement assures that current can pass underneath the sense contacts in order to make best use of the Hall effect. At the same time the structure is substantially perfectly symmetric if sense- and supply-terminals are exchanged in order to cancel the offset.

In the embodiment shown in FIG. 24 the at least two supply contacts 21, 22, and the at least two sense contacts 23, 24 are formed in or on the surfaces of the Hall effect regions 11 to 14 in addition to the corresponding first contacts 31, 33, 35, 37 and the corresponding second contacts 32, 34, 36, 38 so that at least three contacts are formed in or on the surface of each Hall effect region 11 to 14. A Hall effect region, in or on a surface of which a sense contact is formed (i.e., Hall effect regions 11 and 13 in the first operating phase of the spinning current cycle), is between two Hall effect regions, in or on the surfaces of which supply contacts are formed (i.e., Hall effect regions 12 and 14 in the first operating phase of the spinning current cycle).

As can be seen in FIG. 24, the electronic device 100 comprises four Hall effect regions 11 to 14 that are isolated from each other. Each of the four Hall effect regions 11 to 14 comprises a first contact and a second contact in or on a surface of the respective Hall effect region. A first contact 33, 35, 37 of the (k+1)-th Hall effect region is connected to a second contact 32, 34, 36, respectively, of the k-th Hall effect region for k=1 to 3. A first contact 31 of the first Hall effect region 11 is connected to a second contact 38 of the fourth Hall effect region 14. Each of the four Hall effect regions 11 to 14 further comprises one of a supply contact 21, 22 and a sense contact 23, 24 in or on the surface of the Hall effect region, the supply contact 21, 22 or the sense contact 23, 24 being arranged between the first contact 31, 33, 35, 37 and the second contact 32, 34, 36, 38 of the respective Hall effect region. A Hall effect region in or on the surface of which a supply contact is formed is connected via its first and second contacts to two Hall effect regions in or on the surfaces of which a sense contact is formed, respectively, so that the supply contacts and the sense contacts are arranged in a sequence along a current path between at least two supply contacts 21, 22 such that there is one sense contact 23 or 24 between the at least two supply contacts 21, 22. Each Hall effect region 11 to 14 comprises at most one of the at least two supply contacts 21, 22. An advantage of the electronic device shown in FIG. 24 is its high degree of symmetry. In particular, the common mode voltages in both spinning current phases is substantially identical.

Figure 25:
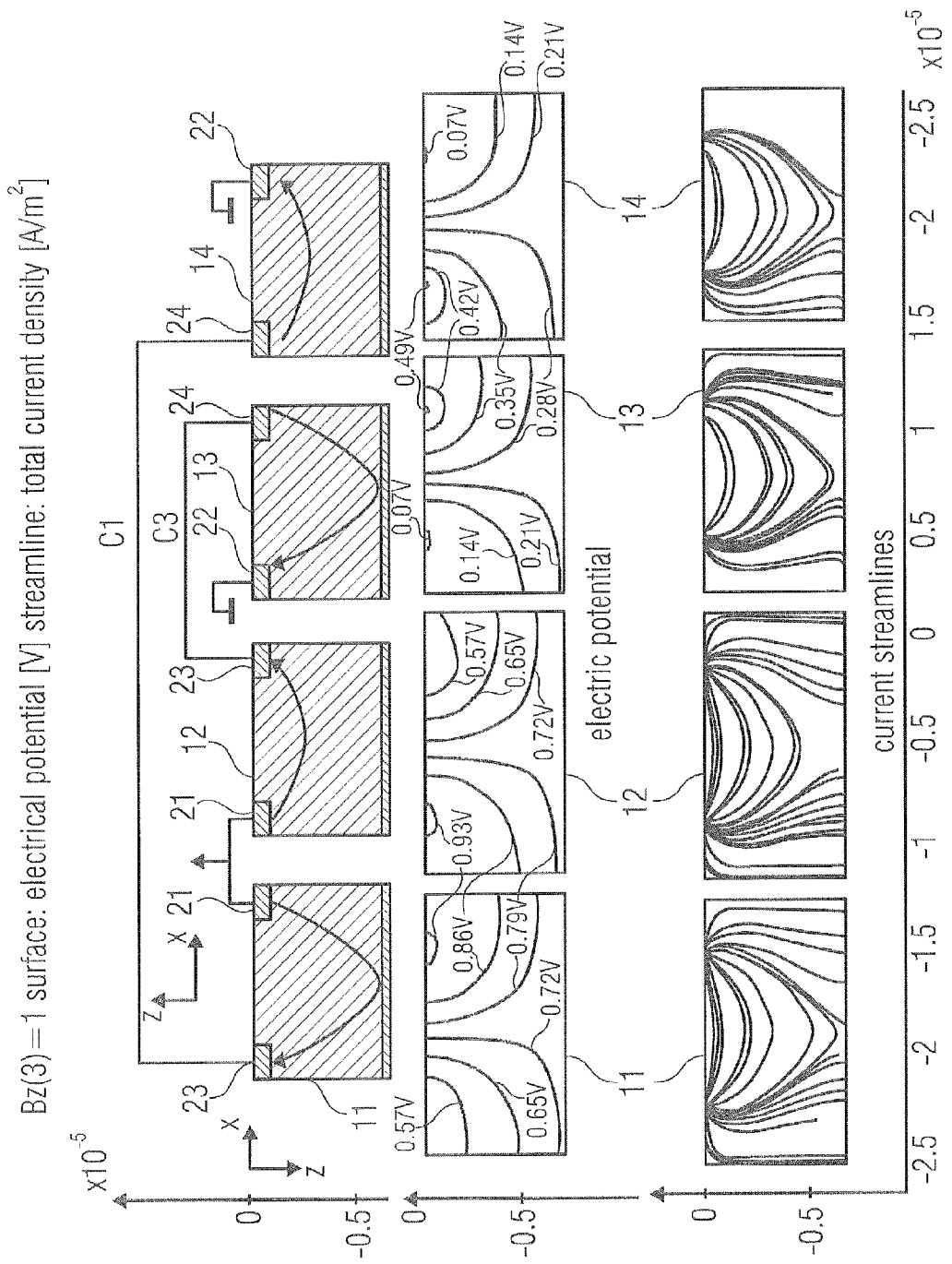
FIG. 25 shows a cross sectional view of the electronic device according to an embodiment of the teachings disclosed herein and a graph illustrating in a cross-sectional view the electric potential and the current density within the four Hall effect regions.

FIG. 25 shows a schematic cross sectional view of an electronic device 10 according to another embodiment of the teachings disclosed herein having 2-contact tubs that are connected to a ring. Furthermore, FIG. 25 also shows a simulated distribution of an electrical potential and a simulated current density distribution. A corresponding plan view can be readily derived from the schematic cross-section of FIG. 25 in an analogous manner as in FIG. 1.

In the schematic cross section it can be seen that an electric current is supplied to the electronic device via the spinning current contact 21. The electric current exits the electronic device at the spinning current contacts 22 of the tubs 13 and 14. Assuming a particular non-zero magnetic field in the y-direction (perpendicular to the drawing plane), the current is pushed towards the bottom of the tubs when traversing the respective tub from right to left (as in tubs 11 and 13). In contrast, the current is pushed towards the top of the tubs and thus close to the sense contacts when it traverses the respective tub from left to right (as in tubs 12 and 14).

In this embodiment, the sense contacts and the ring-contacting contacts 23, 24 coincide. In other words, each supply contact of the at least two supply contacts 21, 22 coincides with at least one of the first and second contacts of at least one Hall effect region (i.e., the ring-contacting contacts), and wherein each sense contact of the at least two sense contacts 23, 24 coincides with at least one of the first and second contacts of at least one Hall effect region. The electronic devices comprises four Hall effect regions so that each of the Hall effect regions has two of the at least eight contacts mentioned in the summary. Typically, each Hall effect region has one supply contact and one sense contact. Hence, a sense contact is between two supply contacts when contemplating the sequence of contacts along a current path (a sense that connects two Hall effect regions counts as one sense contact—that is, the sense contact 23 at the Hall effect region 11 and the sense contact 24 at the Hall effect region 13 count as one sense contact). Therefore, during the first operating phase of the spinning current scheme a differential signal is measured between the first ring connection C1 which connects the tubs 11 and 14, and the second ring connection C3 which connects the tubs 12 and 13.

A linearized model has been used for the purpose of simulation. At 1V supply voltage applied between the contacts 21 and 22, the voltage observed at C1 (with respect to a reference potential) is substantially equal to the voltage observed at C3 (with respect to the same reference potential), i.e. $V_{C1}=V_{C3}=488.483$ mV at By=0, i.e., no magnetic field in the y-direction. In contrast, at a magnetic field strength in the y-direction of By=1 T, the voltage difference at C3 compared to the zero-magnetic field case is $V_{C3}$–488.483 mV=–0.09626 mV. At the same time, the voltage difference at C1 compared to the zero-magnetic field case is $V_{C1}$–488.483 mV=0.1136 mV. Hence, the total magnetic sensitivity is 113.6 µV–(–96.26 µV)=210 µV/V/T which amounts to a relatively poor magnetic sensitivity. Presumably, the reason for the poor magnetic sensitivity of the 2-contact-per-tub electronic device is the fact that the Lorentz force is not able to have a sufficient influence on the signal: The Lorentz force is merely capable of extending the current streamlines slightly towards the depth or urge them slightly to the surface; however, the Lorentz force does not appear to be able to cause a current distribution among two contacts.

Figure 26:
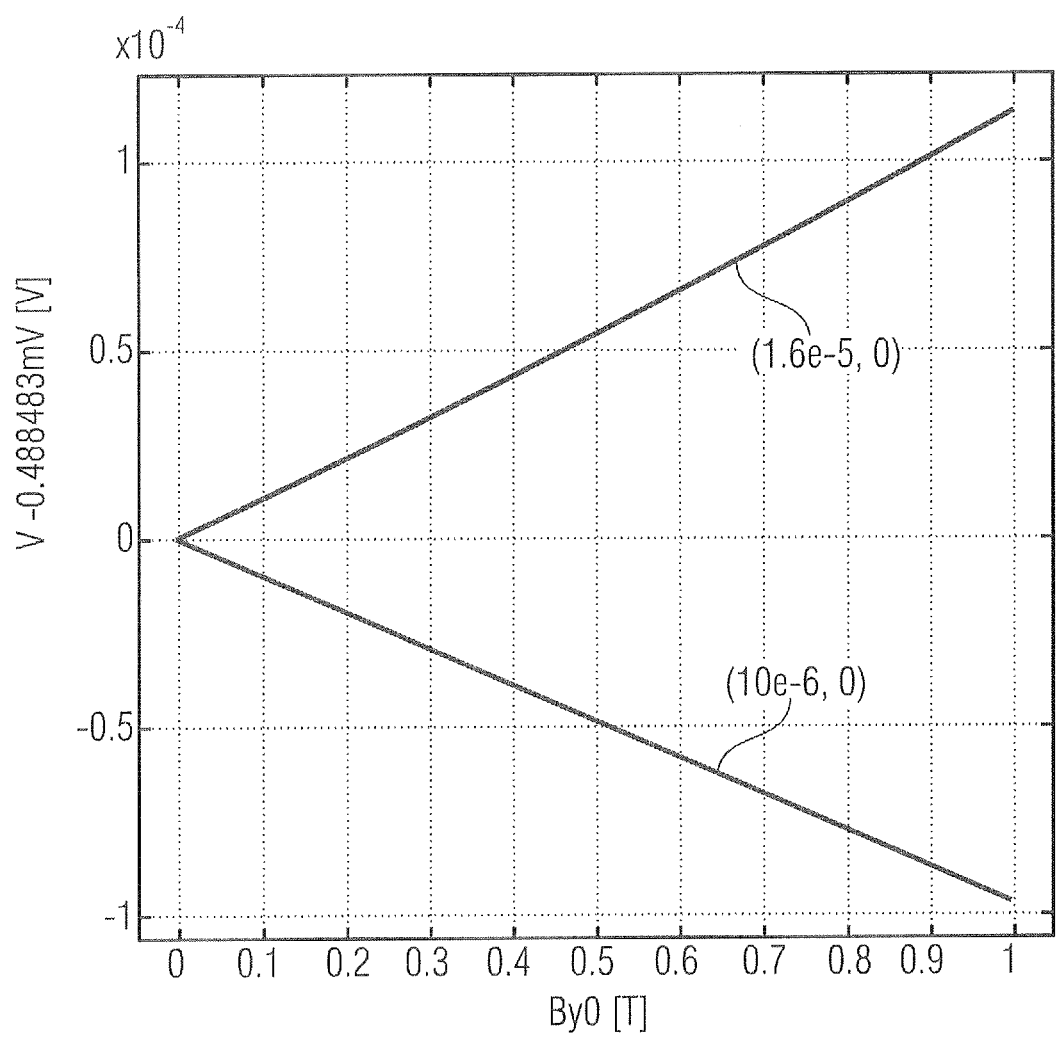
FIG. 26 shows a graph illustrating the electrical potential at two different contacts over the magnetic field strength.

FIG. 26 shows a graph illustrating the electrical potential at two different contacts over the magnetic field strength. The upper line indicates the evolution of the voltage over the magnetic field strength at the contact which is located at $x=1.6\times10^{-5}$ m, i.e. contact 23 which is connected to connection C1. The lower line indicates the evolution of the voltage over the magnetic field strength at the contact which is located at $x=1.0\times10^{-6}$ m, i.e. contact 24 which is connected to connection C3. It can be seen that at a magnetic field strength of 1 T, the voltage difference between C1 and C3 is approximately $2\times10^{-4}$ V=200 µV.

With all above circuits one may also change the sign of the supply voltage and reverse the output voltage simultaneously: this gives a $3^{rd}$ and $4^{th}$ clock phase as is usual in the full spinning current clock cycle. Moreover, the electronic device may further comprise a spinning current controller configured to control the at least one spinning current contact regarding a function thereof as a power supply contact or a sense contact during a particular time interval.

Figure 27:
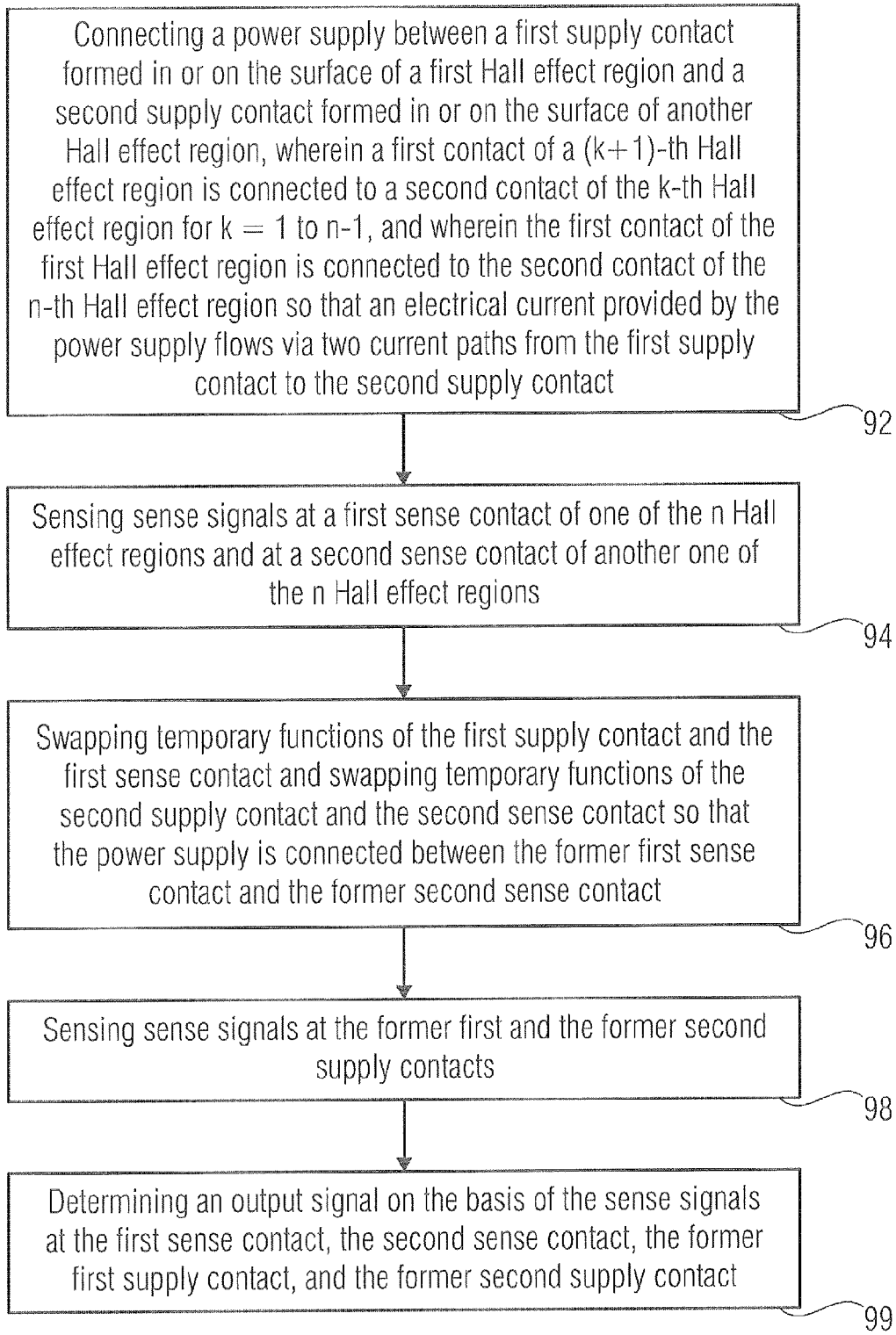
FIG. 27 shows a schematic flow diagram of a sensing method according to an embodiment of the disclosed teachings.

FIG. 27 shows a schematic flow chart of a sensing method according to an embodiment of the disclosed teachings. The method comprises an action 92 during which a power supply gets connected between a first supply contact formed in or on a surface of a first Hall effect region and a second supply contact formed in or on a surface of a n-th Hall effect region. A first contact of the (k+1)-th Hall effect region is connected to a second contact of the k-th Hall effect region for k=1 to n−1. Furthermore, the first contact of the first Hall effect region is connected to the second contact so that an electric current provided by the power supply flows via two current paths from the first supply contact to the second supply contact. For the time being, the power supply stays connected to the first and second supply contacts.

Then, as indicated by the box with the reference numeral 94, sense signals are sensed at a first sense contact of one of the n Hall effect regions and at a second sense contact of another one of the n Hall effect regions. The first sense contact is formed in or on the surface of said Hall effect region of the n Hall effect regions. The second sense contact is formed in or on the surface of said other Hall effect region of the n Hall effect regions. Each Hall effect region has at most one of the at least two sense contacts, i.e., a Hall effect region may have zero or one sense contacts (a single sense contact may be split up into two or more partial, interconnected contacts). The action of sensing a sense signal may comprise sampling a value of an electric potential at the sense contact (referred to a reference potential) or measuring an electric current flowing into the sense contact or out of the sense contact. The sense signal thus acquired may be temporarily stored or supplied to a sample-and-hold circuit until it is used during further processing.

The method continues with swapping, at an action 96 of the sensing method, the temporary functions of the first supply contact and the first sense contact. Likewise, the temporary functions of the second supply contact and the second sense contact are swapped. The swapping of the temporary functions may be summarized as follows: the (former) first supply contact becomes the new first sense contact. The (former) second supply contact becomes the new second sense contact. The (former) first sense contact becomes the new first supply contact. The (former) second sense contact becomes the new second supply contact. The swapping results in the power supply being connected between the former first sense contact and the former second sense contact. The electric current flows from the former first sense contact to the former second sense contact via the n Hall effect regions.

With respect to the swapping of the supply contacts and the sense contacts it should be noted that the supply contacts and the sense contacts are typically multipurpose contacts that may provide a temporary function as a supply contact during a first operating phase of a spinning current scheme and another temporary function as a sense contact during a second operating phase of the spinning current scheme, or vice versa. This concept also applies to a majority of the embodiments relating to an electronic device, to a Hall effect device, or to a mechanical stress sensor. In other words, the denomination of a contact as a supply contact or a sense contact relates to a temporary function of the contact. The temporary function of a supply/sense contact may change during the course of one cycle of the spinning current scheme.

At an action 98 sense signals at the former first supply contact (new first sense contact) and the former second supply contact (new second sense contact) are sensed.

An output signal is then determined on the basis of the sense signals at the first sense contact, the second sense contact, the former first supply contact, and the former second supply contact, as indicated in the flow diagram at the box with the reference numeral 99. The output signal may be a linear combination of the sense signals that have been acquired during the actions 94 and 97. In this manner, an effect of asymmetries of the n Hall effect regions on the output signal can be effectively reduced which in turn leads to a reduce zero point error.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An electronic device comprising:
   a number of n Hall effect regions, with n>1, wherein the n Hall effect regions are isolated from each other;
   wherein the electronic device comprises at least eight contacts in or on surfaces of the n Hall effect regions, wherein the contacts comprise a first and a second contact of each Hall effect region;
   wherein a first contact of the (k+1)-th Hall effect region is connected to a second contact of the k-th Hall effect region for k=1 to n−1, and a first contact of the first Hall effect region is connected to a second contact of the n-th Hall effect region;
   wherein the at least eight contacts comprise at least two supply contacts and at least two sense contacts;
   wherein each Hall effect region comprises at most one of the at least two supply contacts; and
   wherein each Hall effect region comprises at most one of the at least two sense contacts.

2. The electronic device according to claim 1, wherein n=2 so that the number of n Hall effect regions comprises a first Hall effect region and a second Hall effect region,
   wherein one of the at least two supply contacts is formed in or on the surface of the first Hall effect region and another one of the at least two supply contacts is formed in or on the surface of the second Hall effect region, and
   wherein one of the at least two sense contacts is formed in or on the surface of the first Hall effect region and another one of the at least two sense contacts is formed in or on the surface of the second Hall effect region.

3. The electronic device according to claim 2, wherein the first Hall effect region comprises a first end and a second end, and wherein the second Hall effect region comprises a first end and a second end,
   wherein the first and second contacts of the first and second Hall effect regions are closer to one of the first end and the second end of a corresponding one of the first and second Hall effect regions than the at least two supply contacts and the at least two sense contacts.

4. The electronic device according to claim 2, wherein the first and second Hall effect region each comprise a first end and a second end, and wherein the first and second contact of the first and second Hall effect regions are farther away from at least one of the first and second ends of a corresponding one of a first and second Hall effect regions than at least one of the at least two supply contacts and the at least two sense contacts.

5. The electronic device according to claim 1, wherein n=4, wherein the at least two supply contacts and the at least two sense contacts are formed in or on the surfaces of the Hall effect regions in addition to the corresponding first and second contact so that at least three contacts are formed in or on the surface of each Hall effect region, wherein a Hall effect region, in or on a surface of which a sense contact is formed, is electrically connected, by means of the first and second contacts, between two Hall effect regions, in or on the surfaces of which supply contacts are formed.

6. The electronic device according to claim 1, wherein n=4, wherein each supply contact of the at least two supply contacts coincides with at least one of the first and second contacts of at least one Hall effect region, and wherein each sense contact of the at least two sense contacts coincides with at least one of the first and second contacts of at least one Hall effect region.

7. The electronic device according to claim 1, wherein the electronic device is symmetric with respect to at least one center plane.

8. The electronic device according to claim 1, further comprising at least one floating contact formed in or on the surface of at least one of the Hall effect regions.

9. The electronic device according to claim 1, wherein each Hall effect region comprises a first end and a second end, and wherein at least two of the Hall effect regions are disposed side by side so that the first end of the one of the at least two Hall effect regions is adjacent to the second end of an adjacent Hall effect region, and vice versa.

10. The electronic device according to claim 1, wherein at least two of the Hall effect regions are disposed along a line.

11. The electronic device according to claim 1, wherein at least two of the Hall effect regions are disposed at an angle to each other.

12. The electronic device according to claim 1, wherein at least one of the Hall effect regions is longitudinally and laterally offset with respect to at least one other Hall effect region.

13. The electronic device according to claim 1, wherein the Hall effect regions are substantially identical with respect to at least one of lateral geometry, vertical geometry, material, and material properties.

14. The electronic device according to claim 1, wherein all contacts in or on the surface of a Hall effect region are arranged on a straight line.

15. The electronic device according to claim 1, wherein each Hall effect region has a length and a width perpendicular to the length, with the length being larger than the width.

16. The electronic device according to claim 1, wherein at least one contact of the first and second contacts, the at least two supply contacts and the at least two sense contacts are ohmic contacts.

17. An electronic device comprising:
   a first Hall effect region, a second Hall effect region, a third Hall effect region, and a fourth Hall effect region that are isolated from each other, each Hall effect region comprising a first contact, a second contact, a supply contact, and a sense contact in or on surfaces of the Hall effect region;

wherein the first contact of the second Hall effect region is connected to the second contact of the first Hall effect region and the first contact of the first Hall effect region is connected to the second contact of the second Hall effect region, so that two current paths exist between the supply contact of the first Hall effect region and the supply contact of the second Hall effect region;

wherein the first contact of the fourth Hall effect region is connected to the second contact of the third Hall effect region and the first contact of the third Hall effect region is connected to the second contact of the fourth Hall effect region, so that two current paths exist between the supply contact of the third Hall effect region and the supply contact of the fourth Hall effect region;

wherein the supply contacts and the sense contacts are arranged in a sequence along each one of the current paths such that there is one sense contact of the sense contacts between two of the supply contacts; and wherein a first differential sense signal is tapped between the sense contacts of the first and third Hall effect regions and a second differential sense signal is tapped between the sense contacts of the second and fourth Hall effect regions.

18. The electronic device according to claim 17, wherein each of the current paths passes a sense contact of one of the first, second, third, and fourth Hall effect regions at a sense contact location, wherein the sense contact location in a first current path between the supply contacts of the first and second Hall effect regions is upstream of the first contact of the first Hall effect region and the second contact of the second Hall effect region;

wherein the sense contact location in a second current path between the supply contacts of the first and second Hall effect regions is downstream of the second contact of the first Hall effect region and the first contact of the second Hall effect region;

wherein the sense contact location in a first current path between the supply contacts of the third and fourth Hall effect regions is downstream of the first contact of the third Hall effect region and the second contact of the fourth Hall effect region; and wherein and the sense contact location in a second current path between the supply contacts of the third and fourth Hall effect regions is upstream of the second contact of the third Hall effect region and the first contact of the fourth Hall effect region.

19. The electronic device according to claim 18, wherein the first and second Hall effect regions are arranged side by side so that the first end of the first Hall effect region is adjacent to the second end of the second Hall effect region, and vice versa, and wherein the third and fourth Hall effect regions are arranged side by side so that the first end of the third Hall effect region is adjacent to the second end of the fourth Hall effect region, and vice versa.

20. An electronic device, comprising:

four Hall effect regions that are isolated from each other, wherein each of the four Hall effect regions comprises a first contact and a second contact in or on a surface of the Hall effect region, wherein a first contact of the (k+1)-th Hall effect region is connected to a second contact of the k-th Hall effect region for k=1 to 3, and a first contact of the first Hall effect region is connected to a second contact of the fourth Hall effect region;

wherein each of the four Hall effect regions further comprises one of a supply contact and a sense contact in or on the surface of the Hall effect region, the supply contact or the sense contact being arranged between the first contact and the second contact of the Hall effect region;

wherein a Hall effect region in or on the surface of which a supply contact is formed is connected via its first and second contacts to two Hall effect regions in or on the surfaces of which a sense contact is formed, respectively, so that the supply contacts and the sense contacts are arranged in a sequence along a current path between at least two supply contacts such that there is one sense contact between the at least two supply contacts; and wherein each Hall effect region comprises at most one of the at least two supply contacts.

* * * * *